(12) United States Patent
Polishchuk et al.

(10) Patent No.: US 9,929,240 B2
(45) Date of Patent: Mar. 27, 2018

(54) MEMORY TRANSISTOR WITH MULTIPLE CHARGE STORING LAYERS AND A HIGH WORK FUNCTION GATE ELECTRODE

(71) Applicant: Cypress Semiconductor Corporation, San Jose, CA (US)

(72) Inventors: Igor Polishchuk, Fremont, CA (US); Sagy Charel Levy, Zichron Yaakov (IL); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/335,180

(22) Filed: Oct. 26, 2016

(65) Prior Publication Data

US 2017/0092729 A1    Mar. 30, 2017

Related U.S. Application Data

(60) Continuation of application No. 14/811,346, filed on Jul. 28, 2015, now Pat. No. 9,502,543, which is a
(Continued)

(51) Int. Cl.
*H01L 29/00* (2006.01)
*H01L 29/423* (2006.01)
(Continued)

(52) U.S. Cl.
CPC ...... *H01L 29/4234* (2013.01); *H01L 29/0676* (2013.01); *H01L 29/4916* (2013.01);
(Continued)

(58) Field of Classification Search
CPC ............. H01L 29/0676; H01L 29/4234; H01L 29/4916; H01L 29/511; H01L 29/518;
(Continued)

(56) References Cited

U.S. PATENT DOCUMENTS

| 4,257,832 A | 3/1981 | Schwabe et al. |
| 4,395,438 A | 7/1983 | Chiang |

(Continued)

FOREIGN PATENT DOCUMENTS

| CN | 1107254 A | 8/1995 |
| CN | 1801478 A | 7/2006 |

(Continued)

OTHER PUBLICATIONS

"3.3V 64K x 18 Synchronous QuadPort Static RAM," Cypress Preliminary CY7C0430BV, Cypress Semiconductor Corporation, Mar. 27, 2001; 36 pages.
(Continued)

*Primary Examiner* — Nikolay Yushin

(57) ABSTRACT

An example memory device includes a channel positioned between and electrically connecting a first diffusion region and a second diffusion region, and a tunnel dielectric layer, a multi-layer charge trapping layer, and a blocking dielectric layer disposed between the gate structure and the channel. The multi-layer charge trapping layer includes a first dielectric layer disposed abutting a second dielectric layer and an anti-tunneling layer disposed between the first and second dielectric layers. The anti-tunneling layer includes an oxide layer. The first dielectric layer includes oxygen-rich nitride and the second dielectric layer includes oxygen-lean nitride.

18 Claims, 13 Drawing Sheets

Related U.S. Application Data continuation of application No. 14/159,315, filed on Jan. 20, 2014, now Pat. No. 9,093,318, which is a continuation of application No. 13/539,466, filed on Jul. 1, 2012, now Pat. No. 8,633,537, which is a continuation-in-part of application No. 13/288,919, filed on Nov. 3, 2011, now Pat. No. 8,859,374, which is a division of application No. 12/152,518, filed on May 13, 2008, now Pat. No. 8,063,434.

(60) Provisional application No. 60/940,160, filed on May 25, 2007.

(51) Int. Cl.
  *H01L 29/06* (2006.01)
  *H01L 29/49* (2006.01)
  *H01L 29/792* (2006.01)
  *H01L 29/66* (2006.01)
  *H01L 29/51* (2006.01)
  *B82Y 10/00* (2011.01)

(52) U.S. Cl.
  CPC ........ *H01L 29/511* (2013.01); *H01L 29/518* (2013.01); *H01L 29/66833* (2013.01); *H01L 29/7926* (2013.01); *B82Y 10/00* (2013.01)

(58) Field of Classification Search
  CPC ........ H01L 29/66833; H01L 29/7926; H01L 29/792; H01L 29/408; H01L 29/04; H01L 29/16; H01L 29/513; H01L 29/6683; H01L 29/785; H01L 29/78696; B82Y 10/00
  See application file for complete search history.

(56) References Cited

U.S. PATENT DOCUMENTS

| | | |
|---|---|---|
| 4,490,900 A | 1/1985 | Chiu |
| 4,543,707 A | 10/1985 | Ito et al. |
| 4,667,217 A | 5/1987 | Janning |
| 4,843,023 A | 6/1989 | Chiu et al. |
| 4,870,470 A | 9/1989 | Bass et al. |
| 5,179,038 A | 1/1993 | Kinney et al. |
| 5,348,903 A | 9/1994 | Pfiester et al. |
| 5,404,791 A | 4/1995 | Kervagoret |
| 5,405,791 A | 4/1995 | Ahmad et al. |
| 5,408,115 A | 4/1995 | Chang |
| 5,464,783 A | 11/1995 | Kim et al. |
| 5,500,816 A | 3/1996 | Kobayashi |
| 5,543,336 A | 8/1996 | Enami et al. |
| 5,550,078 A | 8/1996 | Sung |
| 5,573,963 A | 11/1996 | Sung |
| 5,773,343 A | 6/1998 | Lee et al. |
| 5,793,089 A | 8/1998 | Fulford et al. |
| 5,817,170 A | 10/1998 | Desu et al. |
| 5,847,411 A | 12/1998 | Morii |
| 5,861,347 A | 1/1999 | Maiti et al. |
| 5,937,323 A | 8/1999 | Orczyk et al. |
| 5,939,333 A | 8/1999 | Hurley et al. |
| 5,972,765 A | 10/1999 | Clark et al. |
| 5,972,804 A | 10/1999 | Tobin et al. |
| 6,001,713 A | 12/1999 | Ramsbey et al. |
| 6,015,739 A | 1/2000 | Gardner et al. |
| 6,020,606 A | 2/2000 | Liao |
| 6,023,093 A | 2/2000 | Gregor et al. |
| 6,025,267 A | 2/2000 | Pey et al. |
| 6,074,915 A | 6/2000 | Chen et al. |
| 6,114,734 A | 9/2000 | Eklund |
| 6,127,227 A | 10/2000 | Lin et al. |
| 6,136,654 A | 10/2000 | Kraft et al. |
| 6,140,187 A | 10/2000 | Debusk et al. |
| 6,147,014 A | 11/2000 | Lyding et al. |
| 6,150,286 A | 11/2000 | Sun et al. |
| 6,153,543 A | 11/2000 | Chesire et al. |
| 6,157,426 A | 12/2000 | Gu |
| 6,162,700 A | 12/2000 | Hwang et al. |
| 6,174,758 B1 | 1/2001 | Nachumovsky |
| 6,174,774 B1 | 1/2001 | Lee |
| 6,214,689 B1 | 4/2001 | Lim et al. |
| 6,217,658 B1 | 4/2001 | Orczyk et al. |
| 6,218,700 B1 | 4/2001 | Papadas |
| 6,268,299 B1 | 7/2001 | Jammy et al. |
| 6,277,683 B1 | 8/2001 | Pradeep et al. |
| 6,287,913 B1 | 9/2001 | Agnello et al. |
| 6,297,096 B1 | 10/2001 | Boaz |
| 6,297,173 B1 | 10/2001 | Tobin et al. |
| 6,321,134 B1 | 11/2001 | Henley et al. |
| 6,335,288 B1 | 1/2002 | Kwan et al. |
| 6,348,380 B1 | 2/2002 | Weimer et al. |
| 6,365,518 B1 | 4/2002 | Lee et al. |
| 6,399,484 B1 | 6/2002 | Yamasaki et al. |
| 6,406,960 B1 | 6/2002 | Hopper et al. |
| 6,429,081 B1 | 8/2002 | Doong et al. |
| 6,433,383 B1 | 8/2002 | Ramsbey et al. |
| 6,440,797 B1 | 8/2002 | Wu et al. |
| 6,444,521 B1 | 9/2002 | Chang et al. |
| 6,445,030 B1 | 9/2002 | Wu et al. |
| 6,461,899 B1 | 10/2002 | Kitakado et al. |
| 6,462,370 B2 | 10/2002 | Kuwazawa |
| 6,468,927 B1 | 10/2002 | Zhang et al. |
| 6,469,343 B1 | 10/2002 | Miura et al. |
| 6,518,113 B1 | 2/2003 | Buynoski |
| 6,559,026 B1 | 5/2003 | Rossman et al. |
| 6,573,149 B2 | 6/2003 | Kizilyalli et al. |
| 6,586,343 B1 | 7/2003 | Ho et al. |
| 6,586,349 B1 | 7/2003 | Jeon et al. |
| 6,596,590 B1 | 7/2003 | Miura et al. |
| 6,599,795 B2 | 7/2003 | Ogata |
| 6,602,771 B2 | 8/2003 | Inoue et al. |
| 6,610,614 B2 | 8/2003 | Niimi et al. |
| 6,624,090 B1 | 9/2003 | Yu et al. |
| 6,661,065 B2 | 12/2003 | Kunikiyo |
| 6,670,241 B1 | 12/2003 | Kamal et al. |
| 6,677,213 B1 | 1/2004 | Ramkumar et al. |
| 6,709,928 B1 | 3/2004 | Jenne et al. |
| 6,713,127 B2 | 3/2004 | Subramony et al. |
| 6,717,860 B1 | 4/2004 | Fujiwara |
| 6,730,566 B2 | 5/2004 | Niimi et al. |
| 6,746,968 B1 | 6/2004 | Tseng et al. |
| 6,768,160 B1 | 7/2004 | Li et al. |
| 6,768,856 B2 | 7/2004 | Akwani et al. |
| 6,774,433 B2 | 8/2004 | Lee et al. |
| 6,787,419 B2 | 9/2004 | Chen et al. |
| 6,818,558 B1 | 11/2004 | Rathor et al. |
| 6,833,582 B2 | 12/2004 | Mine et al. |
| 6,835,621 B2 | 12/2004 | Yoo et al. |
| 6,884,681 B1 | 4/2005 | Kamal et al. |
| 6,903,422 B2 | 6/2005 | Goda et al. |
| 6,906,390 B2 | 6/2005 | Nomoto et al. |
| 6,912,163 B2 | 6/2005 | Zheng et al. |
| 6,913,961 B2 | 7/2005 | Hwang |
| 6,917,072 B2 | 7/2005 | Noguchi et al. |
| 6,946,349 B1 | 9/2005 | Lee et al. |
| 6,958,511 B1 | 10/2005 | Halliyal et al. |
| 7,012,299 B2 | 3/2006 | Mahajani et al. |
| 7,015,100 B1 | 3/2006 | Lee et al. |
| 7,018,868 B1 | 3/2006 | Yang et al. |
| 7,033,890 B2 | 4/2006 | Shone |
| 7,033,957 B1 | 4/2006 | Shiraiwa et al. |
| 7,042,054 B1 | 5/2006 | Ramkumar et al. |
| 7,045,424 B2 | 5/2006 | Kim et al. |
| 7,060,594 B2 | 6/2006 | Wang |
| 7,084,032 B2 | 8/2006 | Crivelli et al. |
| 7,098,154 B2 | 8/2006 | Yoneda |
| 7,112,486 B2 | 9/2006 | Cho et al. |
| 7,115,469 B1 | 10/2006 | Halliyal et al. |
| 7,172,940 B1 | 2/2007 | Chen et al. |
| 7,238,990 B2 | 7/2007 | Burnett et al. |
| 7,250,654 B2 | 7/2007 | Chen et al. |
| 7,253,046 B2 | 8/2007 | Higashi et al. |
| 7,262,457 B2 | 8/2007 | Hsu et al. |
| 7,279,740 B2 | 10/2007 | Bhattacharyya et al. |

(56) References Cited

U.S. PATENT DOCUMENTS

| | | |
|---|---|---|
| 7,301,185 B2 | 11/2007 | Chen et al. |
| 7,312,496 B2 | 12/2007 | Hazama |
| 7,315,474 B2 | 1/2008 | Lue |
| 7,323,742 B2 | 1/2008 | Georgescu |
| 7,338,869 B2 | 3/2008 | Fukada et al. |
| 7,365,389 B1 | 4/2008 | Jeon et al. |
| 7,372,113 B2 | 5/2008 | Tanaka et al. |
| 7,390,718 B2 | 6/2008 | Roizin et al. |
| 7,410,857 B2 | 8/2008 | Higashi et al. |
| 7,425,491 B2 * | 9/2008 | Forbes .................. B82Y 10/00 257/E21.41 |
| 7,450,423 B2 | 11/2008 | Lai et al. |
| 7,463,530 B2 | 12/2008 | Lue et al. |
| 7,479,425 B2 | 1/2009 | Ang et al. |
| 7,482,236 B2 | 1/2009 | Lee et al. |
| 7,521,751 B2 | 4/2009 | Fujiwara |
| 7,535,053 B2 | 5/2009 | Yamazaki |
| 7,544,565 B2 | 6/2009 | Kwak et al. |
| 7,576,386 B2 * | 8/2009 | Lue ...................... H01L 29/792 257/324 |
| 7,588,986 B2 | 9/2009 | Jung |
| 7,601,576 B2 | 10/2009 | Suzuki et al. |
| 7,612,403 B2 | 11/2009 | Bhattacharyya |
| 7,636,257 B2 | 12/2009 | Lue |
| 7,642,585 B2 | 1/2010 | Wang et al. |
| 7,646,041 B2 | 1/2010 | Chae et al. |
| 7,646,637 B2 | 1/2010 | Liao |
| 7,670,963 B2 | 3/2010 | Ramkumar et al. |
| 7,688,626 B2 | 3/2010 | Lue et al. |
| 7,692,246 B2 | 4/2010 | Dreeskornfeld et al. |
| 7,713,810 B2 | 5/2010 | Hagemeyer et al. |
| 7,714,379 B2 | 5/2010 | Lee |
| 7,723,789 B2 | 5/2010 | Lin et al. |
| 7,737,488 B2 | 6/2010 | Lai et al. |
| 7,790,516 B2 | 9/2010 | Willer et al. |
| 7,879,738 B2 | 2/2011 | Wang |
| 7,910,429 B2 | 3/2011 | Dong et al. |
| 7,927,951 B2 | 4/2011 | Kim et al. |
| 7,948,799 B2 | 5/2011 | Lue et al. |
| 7,999,295 B2 | 8/2011 | Lai et al. |
| 8,008,713 B2 | 8/2011 | Dobuzinsky et al. |
| 8,063,434 B1 | 11/2011 | Polishchuk et al. |
| 8,067,284 B1 | 11/2011 | Levy |
| 8,071,453 B1 | 12/2011 | Ramkumar et al. |
| 8,093,128 B2 | 1/2012 | Koutny et al. |
| 8,143,129 B2 | 3/2012 | Ramkumar et al. |
| 8,163,660 B2 | 4/2012 | Puchner et al. |
| 8,222,688 B1 | 7/2012 | Jenne et al. |
| 8,264,028 B2 | 9/2012 | Lue et al. |
| 8,283,261 B2 | 10/2012 | Ramkumar |
| 8,315,095 B2 | 11/2012 | Lue et al. |
| 8,318,608 B2 | 11/2012 | Ramkumar et al. |
| 8,482,052 B2 | 7/2013 | Lue et al. |
| 8,633,537 B2 | 1/2014 | Polishchuk et al. |
| 8,643,124 B2 | 2/2014 | Levy et al. |
| 8,710,578 B2 | 4/2014 | Jenne et al. |
| 8,859,374 B1 | 10/2014 | Polishchuk et al. |
| 8,860,122 B1 | 10/2014 | Polishchuk et al. |
| 8,940,645 B2 | 1/2015 | Ramkumar et al. |
| 8,993,453 B1 | 3/2015 | Ramkumar et al. |
| 9,093,318 B2 | 7/2015 | Polishchuk et al. |
| 9,306,025 B2 | 4/2016 | Polishchuk et al. |
| 9,349,824 B2 | 5/2016 | Levy et al. |
| 9,355,849 B1 | 5/2016 | Levy et al. |
| 9,449,831 B2 | 9/2016 | Levy et al. |
| 9,502,543 B1 | 11/2016 | Polishchuk et al. |
| 2001/0052615 A1 | 12/2001 | Fujiwara |
| 2002/0020890 A1 | 2/2002 | Willer |
| 2002/0048200 A1 | 4/2002 | Kuwazawa |
| 2002/0048893 A1 | 4/2002 | Kizilyalli et al. |
| 2002/0109138 A1 | 8/2002 | Forbes |
| 2002/0141237 A1 | 10/2002 | Goda et al. |
| 2002/0154878 A1 | 10/2002 | Akwani et al. |
| 2003/0030100 A1 | 2/2003 | Lee et al. |
| 2003/0122204 A1 | 7/2003 | Nomoto et al. |
| 2003/0123307 A1 | 7/2003 | Lee et al. |
| 2003/0124873 A1 | 7/2003 | Xing et al. |
| 2003/0169629 A1 | 9/2003 | Goebel et al. |
| 2003/0183869 A1 | 10/2003 | Crivelli et al. |
| 2003/0227049 A1 | 12/2003 | Sakakibara |
| 2004/0067619 A1 | 4/2004 | Niimi et al. |
| 2004/0071030 A1 | 4/2004 | Goda et al. |
| 2004/0094793 A1 | 5/2004 | Noguchi et al. |
| 2004/0104424 A1 | 6/2004 | Yamazaki |
| 2004/0129986 A1 | 7/2004 | Kobayashi et al. |
| 2004/0129988 A1 | 7/2004 | Rotondaro et al. |
| 2004/0173918 A1 | 9/2004 | Kamal et al. |
| 2004/0183091 A1 | 9/2004 | Hibino |
| 2004/0183122 A1 | 9/2004 | Mine et al. |
| 2004/0207002 A1 | 10/2004 | Ryu et al. |
| 2004/0227196 A1 | 11/2004 | Yoneda |
| 2004/0227198 A1 | 11/2004 | Mitani et al. |
| 2004/0251489 A1 | 12/2004 | Jeon et al. |
| 2005/0026637 A1 | 2/2005 | Fischer et al. |
| 2005/0056892 A1 | 3/2005 | Seliskar |
| 2005/0062098 A1 | 3/2005 | Mahajani et al. |
| 2005/0070126 A1 | 3/2005 | Senzaki |
| 2005/0079659 A1 | 4/2005 | Duan et al. |
| 2005/0093054 A1 | 5/2005 | Jung |
| 2005/0098839 A1 | 5/2005 | Lee et al. |
| 2005/0110064 A1 | 5/2005 | Duan et al. |
| 2005/0116279 A1 | 6/2005 | Koh |
| 2005/0141168 A1 | 6/2005 | Lee et al. |
| 2005/0186741 A1 | 8/2005 | Roizin et al. |
| 2005/0205920 A1 | 9/2005 | Jeon et al. |
| 2005/0224866 A1 | 10/2005 | Higashi et al. |
| 2005/0227501 A1 | 10/2005 | Tanabe et al. |
| 2005/0230766 A1 | 10/2005 | Nomoto et al. |
| 2005/0236679 A1 | 10/2005 | Hori et al. |
| 2005/0245034 A1 | 11/2005 | Fukuda et al. |
| 2005/0266637 A1 | 12/2005 | Wang |
| 2005/0275010 A1 | 12/2005 | Chen et al. |
| 2005/0275012 A1 | 12/2005 | Nara et al. |
| 2006/0008959 A1 * | 1/2006 | Hagemeyer ........... H01L 27/115 438/197 |
| 2006/0017092 A1 | 1/2006 | Dong et al. |
| 2006/0051880 A1 | 3/2006 | Doczy et al. |
| 2006/0065919 A1 | 3/2006 | Fujiwara |
| 2006/0081331 A1 | 4/2006 | Campian |
| 2006/0111805 A1 | 5/2006 | Yokoyama et al. |
| 2006/0113586 A1 * | 6/2006 | Wang .................... H01L 29/513 257/324 |
| 2006/0113627 A1 | 6/2006 | Chen et al. |
| 2006/0131636 A1 | 6/2006 | Jeon et al. |
| 2006/0160303 A1 | 7/2006 | Ang et al. |
| 2006/0192248 A1 | 8/2006 | Wang |
| 2006/0202261 A1 | 9/2006 | Lue et al. |
| 2006/0202263 A1 | 9/2006 | Lee |
| 2006/0220106 A1 | 10/2006 | Choi et al. |
| 2006/0226490 A1 | 10/2006 | Burnett et al. |
| 2006/0228841 A1 | 10/2006 | Kim et al. |
| 2006/0228899 A1 | 10/2006 | Nansei et al. |
| 2006/0228907 A1 | 10/2006 | Cheng et al. |
| 2006/0237803 A1 | 10/2006 | Zhu et al. |
| 2006/0261401 A1 | 11/2006 | Bhattacharyya |
| 2006/0281331 A1 | 12/2006 | Wang |
| 2006/0284236 A1 * | 12/2006 | Bhattacharyya ....... B82Y 10/00 257/314 |
| 2007/0012988 A1 | 1/2007 | Bhattacharyya |
| 2007/0029625 A1 * | 2/2007 | Lue ...................... H01L 29/792 257/411 |
| 2007/0031999 A1 | 2/2007 | Ho et al. |
| 2007/0048916 A1 | 3/2007 | Suzuki et al. |
| 2007/0049048 A1 | 3/2007 | Rauf et al. |
| 2007/0051306 A1 | 3/2007 | Ivanov et al. |
| 2007/0066087 A1 | 3/2007 | Jung |
| 2007/0121380 A1 | 5/2007 | Thomas |
| 2007/0200168 A1 | 8/2007 | Ozawa et al. |
| 2007/0210371 A1 | 8/2007 | Hisamoto et al. |
| 2007/0215940 A1 | 9/2007 | Ligon |
| 2007/0231991 A1 | 10/2007 | Willer et al. |
| 2007/0232007 A1 * | 10/2007 | Forbes .................. B82Y 10/00 438/301 |
| 2007/0246753 A1 | 10/2007 | Chu et al. |

(56) References Cited

U.S. PATENT DOCUMENTS

| | | | |
|---|---|---|---|
| 2007/0262451 A1 | 11/2007 | Rachmady et al. |
| 2007/0267687 A1 | 11/2007 | Lue |
| 2007/0268753 A1 | 11/2007 | Lue et al. |
| 2007/0272916 A1 | 11/2007 | Wang et al. |
| 2007/0272971 A1 | 11/2007 | Lee et al. |
| 2008/0009115 A1 | 1/2008 | Willer et al. |
| 2008/0029399 A1 | 2/2008 | Tomita et al. |
| 2008/0048237 A1 | 2/2008 | Iwata |
| 2008/0054346 A1 | 3/2008 | Saitoh et al. |
| 2008/0057644 A1 | 3/2008 | Kwak et al. |
| 2008/0087942 A1 | 4/2008 | Hsu et al. |
| 2008/0121932 A1 | 5/2008 | Ranade |
| 2008/0135946 A1 | 6/2008 | Yan |
| 2008/0146042 A1 | 6/2008 | Kostamo et al. |
| 2008/0150003 A1 | 6/2008 | Chen et al. |
| 2008/0175053 A1 | 7/2008 | Lue et al. |
| 2008/0237684 A1 | 10/2008 | Specht et al. |
| 2008/0237694 A1 | 10/2008 | Specht et al. |
| 2008/0258203 A1 | 10/2008 | Happ et al. |
| 2008/0272424 A1* | 11/2008 | Kim .................. H01L 21/28282 257/321 |
| 2008/0286927 A1 | 11/2008 | Kim et al. |
| 2008/0290398 A1 | 11/2008 | Polishchuk et al. |
| 2008/0290399 A1 | 11/2008 | Levy et al. |
| 2008/0290400 A1 | 11/2008 | Jenne et al. |
| 2008/0291726 A1 | 11/2008 | Lue et al. |
| 2008/0293207 A1 | 11/2008 | Koutny et al. |
| 2008/0293254 A1 | 11/2008 | Ramkumar et al. |
| 2008/0293255 A1 | 11/2008 | Ramkumar |
| 2008/0296664 A1 | 12/2008 | Ramkumar et al. |
| 2009/0011609 A1 | 1/2009 | Ramkumar et al. |
| 2009/0039414 A1 | 2/2009 | Lue et al. |
| 2009/0045452 A1 | 2/2009 | Lue et al. |
| 2009/0065849 A1 | 3/2009 | Noda |
| 2009/0152618 A1 | 6/2009 | Matsuo et al. |
| 2009/0152621 A1 | 6/2009 | Polishchuk et al. |
| 2009/0179253 A1 | 7/2009 | Levy et al. |
| 2009/0206385 A1 | 8/2009 | Kim et al. |
| 2009/0227116 A1 | 9/2009 | Joo et al. |
| 2009/0242969 A1 | 10/2009 | Tanaka |
| 2009/0294836 A1 | 12/2009 | Kiyotoshi |
| 2009/0294844 A1 | 12/2009 | Tanaka et al. |
| 2009/0302365 A1 | 12/2009 | Bhattacharyya |
| 2010/0006922 A1 | 1/2010 | Matsuoka et al. |
| 2010/0041222 A1 | 2/2010 | Puchner et al. |
| 2010/0096687 A1 | 4/2010 | Balseanu et al. |
| 2010/0117138 A1 | 5/2010 | Huerta et al. |
| 2010/0117139 A1 | 5/2010 | Lue |
| 2010/0155823 A1 | 6/2010 | Lue et al. |
| 2010/0178759 A1 | 7/2010 | Kim et al. |
| 2010/0252877 A1 | 10/2010 | Nakanishi et al. |
| 2010/0270609 A1 | 10/2010 | Olsen et al. |
| 2010/0283097 A1 | 11/2010 | Endoh et al. |
| 2010/0295118 A1 | 11/2010 | Bhattacharyya |
| 2011/0018053 A1 | 1/2011 | Lo et al. |
| 2011/0163371 A1 | 7/2011 | Song et al. |
| 2011/0237060 A1 | 9/2011 | Lee et al. |
| 2011/0248332 A1 | 10/2011 | Levy et al. |
| 2012/0007167 A1 | 1/2012 | Hung et al. |
| 2012/0068159 A1 | 3/2012 | Fujiki et al. |
| 2012/0068250 A1 | 3/2012 | Ino et al. |
| 2013/0175604 A1 | 7/2013 | Polishchuk et al. |
| 2013/0309826 A1 | 11/2013 | Ramkumar et al. |
| 2014/0264551 A1 | 9/2014 | Polishchuk et al. |
| 2016/0300724 A1 | 10/2016 | Levy et al. |

FOREIGN PATENT DOCUMENTS

| | | |
|---|---|---|
| CN | 1832201 A | 9/2006 |
| CN | 101517714 A | 8/2009 |
| CN | 101859702 A | 10/2010 |
| CN | 101558481 B | 5/2012 |
| CN | 104254921 A | 12/2014 |
| JP | 2005347679 | 12/2005 |
| JP | 2007515060 A | 6/2007 |
| JP | 2007318112 | 12/2007 |
| JP | 2009260070 | 11/2009 |
| KR | 20040070669 A | 8/2004 |
| KR | 20060100092 | 9/2006 |
| TW | 200703671 A | 1/2007 |
| TW | 200847343 A | 12/2008 |
| WO | 2007064048 A1 | 6/2007 |
| WO | 2008129478 A | 10/2008 |
| WO | 2011162725 A1 | 12/2011 |
| WO | 2013148112 A1 | 10/2013 |
| WO | 2013148343 A1 | 10/2013 |

OTHER PUBLICATIONS

Hua-Ching Chien, Chin-Hsing Kao, Jui-Wen Chang and Tzung-Kuen Tsai_Two-bit SONOS type Flash using a band engineering in the nitride layer_Dated Jun. 17, 2005_4 pages.

Hung et al., High-performance gate-all-around polycrystalline silicon nanowire with silicon nanocrystals nonvolatile memory, Appl. Phys. Lett, 98 162108 (2011), pub date: Apr. 22, 2011.

Krishnaswamy Ramkumar_Cypress SONOS Technology_Dated Jul. 6, 2011_9 pages.

USPTO Notice of Allowance for U.S. Appl. No. 13/539,466 dated Nov. 13, 2013; 9 pages.

USPTO Notice of Allowance for U.S. Appl. No. 13/539,466 dated Nov. 27, 2012; 8 pages.

USPTO Notice of Allowance for U.S. Appl. No. 13/620,071 dated Jan. 23, 2015; 5 pages.

USPTO Notice of Allowance for U.S. Appl. No. 13/620,071 dated Oct. 27, 2014; 7 pages.

USPTO Notice of Allowance for U.S. Appl. No. 14/159,315 dated Feb. 18, 2015; 9 pages.

USPTO Notice of Allowance for U.S. Appl. No. 14/159,315 dated Mar. 23, 2015; 9 pages.

USPTO Notice of Allowance for U.S. Appl. No. 14/307,858 dated Nov. 27, 2015; 5 pages.

USPTO Notice of Allowance for U.S. Appl. No. 14/811,346 dated Jul. 19, 2016; 7 pages.

USPTO Requirement for Restriction for U.S. Appl. No. 12/152,518 dated Jun. 9, 2010; 5 pages.

USPTO Requirement for Restriction for U.S. Appl. No. 14/307,858 dated May 18, 2015; 7 pages.

"MAX 9000 Programmable Logic Device Family," Altera, Jul. 1999, Version 6.01, pp. 1-40; 41 pages.

L. Richard Carley, "Trimming Analog Circuits Using Floating-Gate Analog MOS Memory," IEEE Journal of Solid-State circuits, vol. 24, No. 6, Dec. 1989, pp. 1569-1575; 7 pages.

"1.8V, 500-MHz, 10-Output JEDEC-Compliant Zero Delay Buffer," Cypress Advance Information, Feb. 12, 2004; 9 pages.

"10 Gigabit Ethernet Technology Overview White Paper", Revision 1.0, Retrieved from Internet: URL: http://www.10gea.org, May 2001.

"16K x 8/9 Dual-Port Static RAM with Sem, Int, Busy," Cypress Semiconductor Data Book, May 1995, CY7C006 and CY7C016, pp. 6:1-17; 10 pages.

"1K x 8 Dual-Port Static RAM," Cypress Semiconductor Data Book, May 1995, CY7C130/CY7C131 and CY7C140/CY7C141, pp. 6:37-49; 8 pages.

"1kHz to 30MHz Resistor Set SOT-23 Oscillator", Initial Release Final Electrical Specifications LTC1799, Linear Technology Corporation, Jan. 2001, pp. 1-4.

"200-MBaud HOTLink Transceiver," Cypress Semiconductor Corporation, Revised Feb. 13, 2004, CY7C924ADX, Document #38-02008 Rev. *D; 62 pages.

"2K x 16 Dual-Port Static Ram," Cypress Semiconductor Data Book, May 1995, CY7C133 and CY7C143, pp. 6:63-73; 7 pages.

"2K x 8 Dual-Port Static RAM," Cypress Semiconductor Data Book, May 1995, CY7C132/CY7C136 and CY7C142/CY7C146, pp. 6:50-62; 8 pages.

"A Novel Integration Technology of EEPROM Embedded CMOS Logic VLSI Suitable for ASIC Applications", by Masataka Takebuchi et al., IEEE 1992 Custom Integrated Circuits Conference, pp. 9.6.1-9.6.4.

(56) References Cited

OTHER PUBLICATIONS

"A Novel Robust and Low Cost Stack Chips Package and Its Thermal Performance", by Soon-Jin Cho et al., IEEE Transaction on Advanced Packaging, vol. 23, No. 2, May 2000, pp. 257-265.
"A Planar Type EEPROM Cell Structure by Standard CMOS Process for Integration with Gate Array, Standard Cell, Microprocessor and for Neural Chips", by Katsuhiko Ohsaki et al., IEEE 1993 Custom Integrated Circuits Conference, pp-23.6.1-23.6A.
"A Single Chip Sensor & Image Processor for Fingerprint Verification" Anderson, S., et al., IEEE Custom Integrated Circuits Conference, May 12-15, 1991.
"A Single Poly EPROM for Custom CMOS Logic Applications", by Reza Kazerounian et al., IEEE 1986 Custom Integrated Circuits Conference, pp. 59-62.
"A Wide-Bandwidth Low-Voltage PLL for PowerPC.TM. Microprocessors", by Jose Alvarez et al., IEEE Journal of Solid-State Circuits, vol. 30, No. 4, Apr. 1995, pp. 383-391.
"About SMaL Camera Technologies, Inc.", SMaL Camera Technologies, 2001, 1 page.
"Achieving Uniform nMOS Device Power Distribution for Submicron ESD Reliability;" Charvaka Duwuy, Carlos Diaz, and Tim Haddock; 1992; 92-131 through 92-134, no month.
"ADNS-2030 High Performance, Low Power Optical Mouse Sensor (Optimized for Cordless Mouse Applications)," Agilent Technologies, downloaded Oct. 10, 2005, <http://www.home.agilent.com/USeng/nav/-536893734,536883737/pd.html>; 2 pages.
"ADNS-2051 High-Performance Optical Mouse Sensor," Agilent Technologies, downloaded Oct. 10, 2005, <http://www.home.agilent.com/USeng/nav/-536893734,536883737/pd.html>; 2 pages.
"Agilent ADNK-2030 Solid-State Optical Mouse Sensor," Agilent Technologies Inc., Sample Kit, 2003; 1 page.
"Agilent ADNS-2030 Low Power Optical Mouse Sensor," Agilent Technologies Inc., Data Sheet, 2005; 34 pages.
"Agilent ADNS-2051 Optical Mouse Sensor," Agilent Technologies Inc., Product Overview, 2003; 2 pages.
"Agilent Optical Mouse Sensors," Agilent Technologies Inc., Selection Guide, 2004; 3 pages.
"Algorithm for Managing Multiple First-In, First-Out Queues from a Single Shared Random-Access Memory," IBM Technical Disclosure Bulletin, Aug. 1989; 5 pages.
"Am99C10A 256.times.48 Content Addressable Memory", Advanced Micro Devices, Dec. 1992.
"An Analog PPL-Based Clock and Data Recovery Circuit with High Input Jitter Tolerance;" Sun, Reprinted from IEEE Journal of Solid-State Circuits, 1989; 4 pages.
"An EEPROM for Microprocessors and Custom Logic", by Roger Cuppens et al., IEEE Journal of Solid-State Circuits, vol. SC-20, No. 2, Apr. 1985, pp. 603-608.
"An EPROM Cell Structure foe EPLDs Compatible with Single Poly Gate Process", by Kuniyushi Yoshikawa et al., Extended Abstracts of the 18th (1986 International) Conference on Solid State Devices and Materials, Tokyo, 1986, pp. 323-326.
"An Experimental 5-V-Only 256-kbit CMOS EEPROM with a High-Performance Single-Polysilicon Cell", by Jun-Ichi Vliyamoto et al., IEEE Journal of Solid State Circuits, vol. SC-21, No. 5, Oct. 1986, pp. 852-860.
Chen et al., "Performance Improvement of SONOS Memory by Bandgap Engineering of Charge-Trapping Layer," IEEE Electron Device Letters, Apr. 2004, vol. 25, No. 4, pp. 205-207; 3 pages.
European Search Report for European Application No. 13767422.2 dated Mar. 30, 2017; 6 pages.
European Search Report for European Application No. 13767422.2 dated Oct. 20, 2015; 5 pages.
International Search Report for International Application No. PCT/US08/06627 dated Aug. 26, 2008; 2 pages.
International Search Report for International Application No. PCT/US12/021583 dated May 8, 2012; 2 pages.
International Search Report for International Application No. PCT/US13/32339 dated May 30, 2013; 2 pages.
International Search Report for International Application No. PCT/US13/48876 dated Jul. 26, 2013; 5 pages.
International Search Report for International Application No. PCT/US13/48885 dated Nov. 14, 2013; 2 pages.
Lue et al., "BE-SONOS: A Bandgap Engineered SONOS with Excellent Performance and Reliability," IEEE, 2005; 4 pages.
Lue, Hang-Ting et al., "Reliability Model of Bandgap Engineered SONOS (be-SONOS)", IEEE, 2006, 4 pgs.
Milton Ohring, "The Materials Science of Thin Films: Deposition and Structure," 2nd Edition, Academic Press, 2002, pp. 336-337; 4 pages.
SIPO Office Action for Application No. 201380031840.8 dated Jan. 6, 2017; 8 pages.
Wang, Szu-Yu et al., "Reliability and processing effects of bandgap engineered SONOS flash memory", 2007 IEEE, International Reliability Symposium, Apr. 18, 2007, 5 pgs.
Written Opinion of the International Searching Authority for International Application No. PCT/US08/06627 dated Aug. 26, 2008; 5 pages.
Written Opinion of the International Searching Authority for International Application No. PCT/US13/32339 dated May 30, 2013; 7 pages.
Written Opinion of the International Searching Authority for International Application No. PCT/US13/48876 dated Jul. 26, 2013; 3 pages.
Written Opinion of the International Searching Authority for International Application No. PCT/US2012/21583 dated May 8, 2012; 4 pages.
Written Opinion of the International Searching Authority for International Application No. PCT/US2013/048885 dated Nov. 14, 2013; 7 pages.
Wu et al., "SONOS Device with Tapered Bandgap Nitride Layer," IEEE Transactions on Electron Devices, May 2005, vol. 52, No. 5, pp. 987-992; 6 pages.
Yang et al., "Reliability considerations in scaled SONOS nonvolatile memory devices, solid state Electronics", 43(1999)2025-2032.
Chinese Office Action for Application No. 200880000820.3 dated Jan. 26, 2011; 6 pages.
SIPO Office Action for CN Application No. 201380031969.9 dated Aug. 19, 2016; 8 pages.
USPTO Advisory Action for U.S. Appl. No. 12/197,466 dated Jan. 31, 2012; 3 pages.
USPTO Advisory Action for U.S. Appl. No. 14/605,231 dated Mar. 9, 2016; 3 pages.
USPTO Advisory Action for U.S. Appl. No. 14/605,231 dated Jul. 5, 2016; 3 pages.
USPTO Final Rejection for U.S. Appl. No. 12/124,855 dated Jan. 31, 2012; 7 pages.
USPTO Final Rejection for U.S. Appl. No. 12/124,855 dated May 10, 2010; 11 pages.
USPTO Final Rejection for U.S. Appl. No. 12/197,466 dated Nov. 17, 2011; 13 pages.
USPTO Final Rejection for U.S. Appl. No. 14/307,858 dated Oct. 8, 2015; 6 pages.
USPTO Final Rejection for U.S. Appl. No. 14/605,231 dated Dec. 17, 2015; 15 pages.
USPTO Non Final Rejection for U.S. Appl. No. 13/539,458 dated Mar. 13, 2013; 5 pages.
USPTO Non Final Rejection for U.S. Appl. No. 13/539,458 dated Oct. 2, 2014; 5 pages.
USPTO Non Final Rejection for U.S. Appl. No. 13/620,071 dated Apr. 3, 2014; 12 pages.
USPTO Non Final Rejection for U.S. Appl. No. 13/620,071 dated Jul. 18, 2014; 5 pages.
USPTO Non-Final Rejection for U.S. Appl. No. 12/124,855 dated Jan. 18, 2011; 5 pages.
USPTO Non-Final Rejection for U.S. Appl. No. 12/124,855 dated Aug. 16, 2011; 9 pages.
USPTO Non-Final Rejection for U.S. Appl. No. 12/124,855 dated Oct. 29, 2009; 9 pages.
USPTO Non-Final Rejection for U.S. Appl. No. 12/152,518 dated Mar. 9, 2011; 4 pages.

(56) References Cited

OTHER PUBLICATIONS

USPTO Non-Final Rejection for U.S. Appl. No. 12/152,518 dated Sep. 29, 2010; 5 pages.
USPTO Non-Final Rejection for U.S. Appl. No. 12/197,466 dated Jun. 1, 2011; 11 pages.
USPTO Non-Final Rejection for U.S. Appl. No. 13/288,919 dated Jun. 19, 2014; 5 pages.
USPTO Non-Final Rejection for U.S. Appl. No. 13/288,919 dated Dec. 5, 2013; 4 pages.
USPTO Non-Final Rejection for U.S. Appl. No. 13/539,466 dated Sep. 28, 2012; 9 pages.
USPTO Non-Final Rejection for U.S. Appl. No. 14/159,315 dated Oct. 21, 2014; 12 pages.
USPTO Non-Final Rejection for U.S. Appl. No. 14/307/858 dated Jun. 29, 2015; 5 pages.
USPTO Non-Final Rejection for U.S. Appl. No. 14/605,231 dated Jul. 7, 2015; 13 pages.
USPTO Notice of Allowance for U.S. Appl. No. 12/124,855 dated May 1, 2012; 7 pages.
USPTO Notice of Allowance for U.S. Appl. No. 12/124,855 dated May 3, 2011; 7 pages.
USPTO Notice of Allowance for U.S. Appl. No. 12/124,855 dated Jul. 28, 2010; 6 pages.
USPTO Notice of Allowance for U.S. Appl. No. 12/124,855 dated Aug. 1, 2012; 7 pages.
USPTO Notice of Allowance for U.S. Appl. No. 12/152,518 dated Jul. 14, 2011; 6 pages.
USPTO Notice of Allowance for U.S. Appl. No. 12/197,466 dated Jun. 15, 2012; 4 pages.
USPTO Notice of Allowance for U.S. Appl. No. 12/197,466 dated Sep. 24, 2012; 8 pages.
USPTO Notice of Allowance for U.S. Appl. No. 13/288,919 dated Apr. 28, 2014; 5 pages.
USPTO Notice of Allowance for U.S. Appl. No. 13/288,919 dated Jul. 8, 2014; 5 pages.
USPTO Notice of Allowance for U.S. Appl. No. 13/288,919 dated Aug. 26, 2014; 7 pages.
USPTO Notice of Allowance for U.S. Appl. No. 13/539,458 dated May 24, 2013; 8 pages.
USPTO Notice of Allowance for U.S. Appl. No. 13/539,458 dated Aug. 4, 2014; 7 pages.
USPTO Notice of Allowance for U.S. Appl. No. 13/539,458 dated Nov. 3, 2014; 7 pages.
USPTO Notice of Allowance for U.S. Appl. No. 13/539,466 dated Sep. 4, 2013; 9 pages.
Japanese Office Action for Japanese Application No. 2013-549612 dated Aug. 4, 2015; 8 pages.
Japanese Office Action for Japanese Application No. 2015-503338 dated Feb. 21, 2017; 21 pages.
SIPO Office Action for Application No. 200910134374.1 dated Jan. 21, 2015; 5 pages.
SIPO Office Action for Application No. 200910134374.1 dated Feb. 3, 2016; 2 pages.
SIPO Office Action for Application No. 200910134374.1 dated Jul. 29, 2014; 5 pages.
SIPO Office Action for Application No. 200910134374.1 dated Jul. 30, 2015; 2 pages.
SIPO Office Action for Application No. 200910134374.1 dated Sep. 22, 2013; 4 pages.
SIPO Office Action for Application No. 20120000107.5 dated Apr. 1, 2015; 5 pages.
SIPO Office Action for Application No. 20120000107.5 dated May 12, 2016; 5 pages.
SIPO Office Action for Application No. 20120000107.5 dated Jul. 25, 2014; 4 pages.
SIPO Office Action for Application No. 20120000107.5 dated Oct. 9, 2015; 2 pages.
SIPO Office Action for Application No. 201280000107.5 dated Nov. 29, 2016; 5 pages.
SIPO Office Action for Application No. 2013800168932 dated Sep. 1, 2016; 7 pages.
TIPO Office Action for Application No. 102110223 dated Nov. 18, 2016; 10 pages.
TIPO Office Action for Taiwan Application No. 101101220 dated Oct. 15, 2015; 4 pages.
USPTO Advisory Action for U.S. Appl. No. 11/811,958 dated Mar. 16, 2010; 4 pages.
USPTO Advisory Action for U.S. Appl. No. 11/811,958 dated Apr. 20, 2010; 6 pages.
USPTO Advisory Action for U.S. Appl. No. 11/811,958 dated May 14, 2013; 4 pages.
USPTO Advisory Action for U.S. Appl. No. 11/811,958 dated Jun. 2, 2011; 5 pages.
USPTO Advisory Action for U.S. Appl. No. 13/436,872 dated Aug. 4, 2015; 2 pages.
USPTO Final Rejection for U.S. Appl. No. 11/811,958 dated Jan. 6, 2010; 17 pages.
USPTO Final Rejection for U.S. Appl. No. 11/811,958 Dated Mar. 13, 2013; 22 pages.
USPTO Final Rejection for U.S. Appl. No. 11/811,958 dated Mar. 15, 2011; 13 pages.
USPTO Final Rejection for U.S. Appl. No. 13/007,533 dated Sep. 24, 2012; 13 pages.
USPTO Final Rejection for U.S. Appl. No. 13/436,872 dated May 27, 2015; 14 pages.
USPTO Non Final Rejection for U.S. Appl. No. 11/811,958 dated Dec. 7, 2011; 13 pages.
USPTO Non Final Rejection for U.S. Appl. No. 13/007,533 dated Apr. 12, 2012; 9 pages.
USPTO Non-Final Rejection for U.S. Appl. No. 11/811,958 dated May 13, 2009; 14 pages.
USPTO Non-Final Rejection for U.S. Appl. No. 11/811,958 dated Oct. 1, 2012; 17 pages.
USPTO Non-Final Rejection for U.S. Appl. No. 11/811,958 dated Oct. 7, 2010; 12 pages.
USPTO Non-Final Rejection for U.S. Appl. No. 13/436,872 dated Dec. 19, 2014; 15 pages.
USPTO Non-Final Rejection for U.S. Appl. No. 13/917,500 dated Jan. 5, 2015; 13 pages.
USPTO Non-Final Rejection for U.S. Appl. No. 14/172,775 dated Jun. 22, 2015; 14 pages.
USPTO Notice of Allowance for U.S. Appl. No. 13/007,533 dated Mar. 7, 2013; 8 pages.
USPTO Notice of Allowance for U.S. Appl. No. 13/007,533 dated Jun. 18, 2013; 9 pages.
USPTO Notice of Allowance for U.S. Appl. No. 13/007,533 dated Sep. 6, 2013; 9 pages.
USPTO Notice of Allowance for U.S. Appl. No. 13/007,533 dated Nov. 27, 2012; 13 pages.
USPTO Notice of Allowance for U.S. Appl. No. 13/007,533 dated Dec. 6, 2013; 10 pages.
USPTO Notice of Allowance for U.S. Appl. No. 13/436,872 dated Jan. 15, 2016; 5 pages.
USPTO Notice of Allowance for U.S. Appl. No. 13/436,872 dated Sep. 15, 2015; 9 pages.
USPTO Notice of Allowance for U.S. Appl. No. 13/917,500 dated Jun. 1, 2015; 6 pages.
USPTO Notice of Allowance for U.S. Appl. No. 13/917,500 dated Sep. 14, 2015; 5 pages.
USPTO Notice of Allowance for U.S. Appl. No. 13/917,500 dated Dec. 31, 2015; 5 pages.
USPTO Notice of Allowance for U.S. Appl. No. 14/172,775 dated Sep. 4, 2015; 7 pages.
USPTO Notice of Allowance for U.S. Appl. No. 14/172,775 dated Dec. 18, 2015; 6 pages.
USPTO Notice of Allowance for U.S. Appl. No. 13/436,872 dated May 11, 2016; 5 pages.
USPTO Requirement for Restriction for U.S. Appl. No. 13/007,533 dated Dec. 6, 2011; 7 pages.
USPTO Requirement Restriction for U.S. Appl. No. 12/197,466 dated Mar. 11, 2011; 5 pages.

(56) References Cited

OTHER PUBLICATIONS

SIPO Office Action for Chinese Application No. 2013800319699 dated May 31, 2017; 11 pages.
TIPO Office Action for Taiwan Application No. 106107213 dated Jul. 4, 2017; 6 pages.
SIPO Office Action for International Application No. 2013800168932 dated Apr. 21, 2017; 7 pages.
USPTO Final Rejection for U.S. Appl. No. 14/605,231 dated Jul. 10, 2017; 7 pages.
USPTO Non-Final Rejection for U.S. Appl. No. 15/376,282 dated Jul. 11, 2017; 16 pages.
SIPO Office Action for Application No. 20120000107.5 dated Sep. 20, 2017; 6 pages.
SIPO Office Action for Application No. 201380031840.8 dated Sep. 25, 2017; 6 pages.
USPTO Non-Final Rejection for U.S. Appl. No. 15/099,025 dated Oct. 6, 2017; 11 pages.
USPTO Non-Final Rejection for U.S. Appl. No. 15/189,668 dated Sep. 22, 2017; 11 pages.
USPTO Notice of Allowance for U.S. Appl. No. 14/605,231 dated Oct. 18, 2017; 8 pages.
Japanese Office Action for Japanese Application No. 2015-503338 dated Dec. 5, 2017; 5 pages.
USPTO Final Rejection for U.S. Appl. No. 15/376,282 dated Dec. 19, 2017; 19 pages.

\* cited by examiner

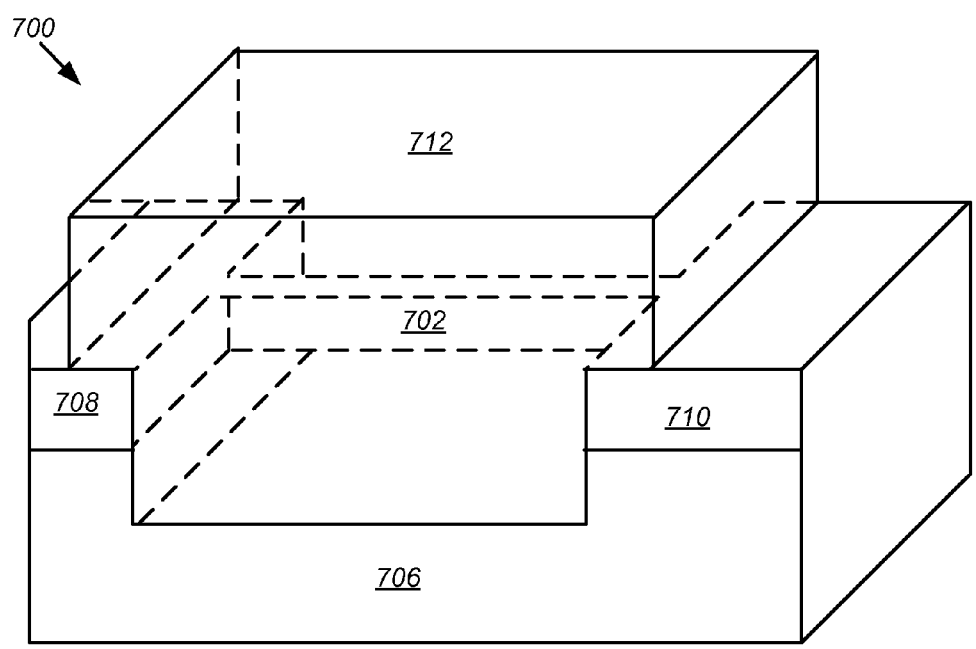
FIG. 7A
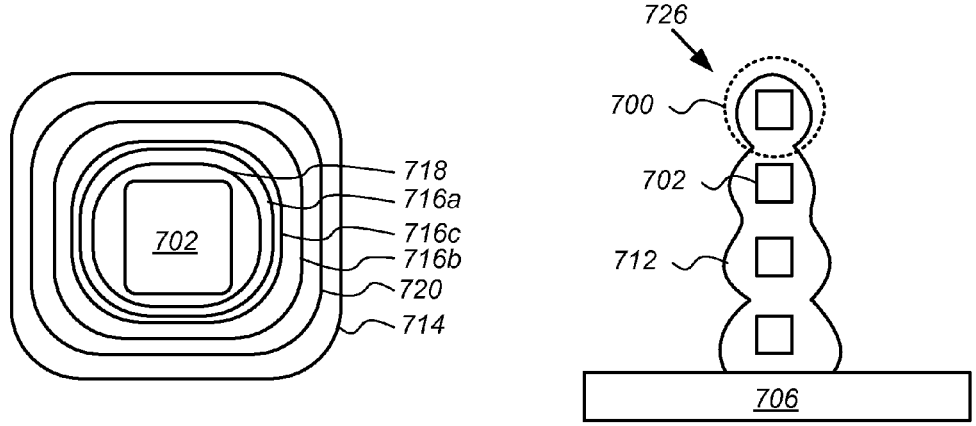
FIG. 7B
FIG. 7C

MEMORY TRANSISTOR WITH MULTIPLE CHARGE STORING LAYERS AND A HIGH WORK FUNCTION GATE ELECTRODE

CROSS-REFERENCE TO RELATED APPLICATIONS

This application is a continuation of U.S. patent application Ser. No. 14/811,346, filed Jul. 28, 2015, which is a continuation of U.S. patent application Ser. No. 14/159,315, filed on Jan. 20, 2014, now U.S. Pat. No. 9,093,318, issued on Jul. 28, 2015 which is a continuation of U.S. patent application Ser. No. 13/539,466, filed on Jul. 1, 2012, now U.S. Pat. No. 8,633,537, issued on Jan. 21, 2014, which is a continuation-in-part of patent application Ser. No. 13/288,919, filed Nov. 3, 2011, now U.S. Pat. No. 8,859,374, issued on Oct. 14, 2014, which is a divisional of U.S. patent Ser. No. 12/152,518, filed May 13, 2008, now U.S. Pat. No. 8,063,434, issued Nov. 22, 2011, which claims the benefit of priority to U.S. Provisional Patent Application No. 60/940,160, filed May 25, 2007, all of which application are hereby incorporated by reference in their entirety.

TECHNICAL FIELD

The present invention relates generally to semiconductor devices, and more particularly to integrated circuits including non-volatile semiconductor memories and methods of fabricating the same.

BACKGROUND

Non-volatile semiconductor memories are devices that can be electrically erased and reprogrammed. One type of non-volatile memory that is widely used for general storage and transfer of data in and between computers and other electronic devices is flash memory, such as a split gate flash memory. A split gate flash memory transistor has an architecture similar to that of a conventional logic transistor, such as Metal-Oxide-Semiconductor Field Effect Transistor (MOSFET), in that it also includes a control gate formed over a channel connecting a source and drain in a substrate. However, the memory transistor further includes a memory or charge trapping layer between the control gate and the channel and insulated from both by insulating or dielectric layers. A programming voltage applied to the control gate traps a charge on the charge trapping layer, partially canceling or screening an electric field from the control gate, thereby changing a threshold voltage (VT) of the transistor and programming the memory cell. During read-out, this shift in VT is sensed by the presence or absence of current flow through the channel with application of a predetermined read-out voltage. To erase the memory transistor, an erase voltage is applied to the control gate to restore, or reverse the shift in VT.

An important measure of merit for flash memories is data retention time, which is the time for which the memory transistor can hold charge or remain programmed without the application of power. The charge stored or trapped in the charge trapping layer decreases over time due to leakage current through the insulating layers, thereby reducing the difference between a programmed threshold voltage (VTP) and an erased threshold voltage (VTE) limiting data retention of the memory transistor.

One problem with conventional memory transistors and methods of forming the same is that the charge trapping layer typically has poor or decreasing data retention over time, limiting the useful transistor lifetime. Referring to FIG. 1A, if the charge trapping layer is silicon (Si) rich there is a large, initial window or difference between VTP, represented by graph or line 102, and the VTE, represented by line 104, but the window collapse very rapidly in retention mode to an end of life (EOL 106) of less than about 1.E+07 seconds.

Referring to FIG. 1B, if on the other hand the charge trapping layer is if a high quality nitride layer, that is one having a low stoichiometric concentration of Si, the rate of collapse of the window or Vt slope in retention mode is reduced, but the initial program-erase window is also reduced. Moreover, the slope of Vt in retention mode is still appreciably steep and the leakage path is not sufficiently minimized to significantly improve data retention, thus EOL 106 is only moderately improved.

Another problem is that increasingly semiconductor memories combine logic transistors, such as MOSFET's, with memory transistors in integrated circuits (ICs) fabricated on a common substrate for embedded memory or System-On-Chip (SOC) applications. Many of the current processes for forming performance of memory transistors are incompatible with those used for fabricating logic transistors.

Accordingly, there is a need for memory transistors and methods of forming the same that provides improved data retention and increased transistor lifetime. It is further desirable that the methods of forming the memory device are compatible with those for forming logic elements in the same IC formed on a common substrate.

SUMMARY OF THE INVENTION

The present invention provides a solution to these and other problems, and offers further advantages over conventional memory cells or devices and methods of fabricating the same.

Generally, the device includes a memory transistor comprising a polysilicon channel region electrically connecting a source region and a drain region formed in a substrate, an oxide-nitride-nitride-oxide (ONNO) stack disposed above the channel region, and a high work function gate electrode formed over a surface of the ONNO stack. In one embodiment, the ONNO stack includes a multi-layer charge-trapping region including an oxygen-rich first nitride layer and an oxygen-lean second nitride layer disposed above the first nitride layer. In another embodiment, the multi-layer charge-trapping region further includes an oxide anti-tunneling layer separating the first nitride layer from the second nitride layer.

BRIEF DESCRIPTION OF THE DRAWINGS

These and various other features and advantages of the present invention will be apparent upon reading of the following detailed description in conjunction with the accompanying drawings and the appended claims provided below, where:

FIGS. 7A and 7B illustrate a non-planar multigate device including a multi-layer charge-trapping region and a horizontal nanowire channel;

FIG. 7C illustrates a cross-sectional view of a vertical string of non-planar multigate devices of FIG. 7A;

DETAILED DESCRIPTION

Figure 1A:
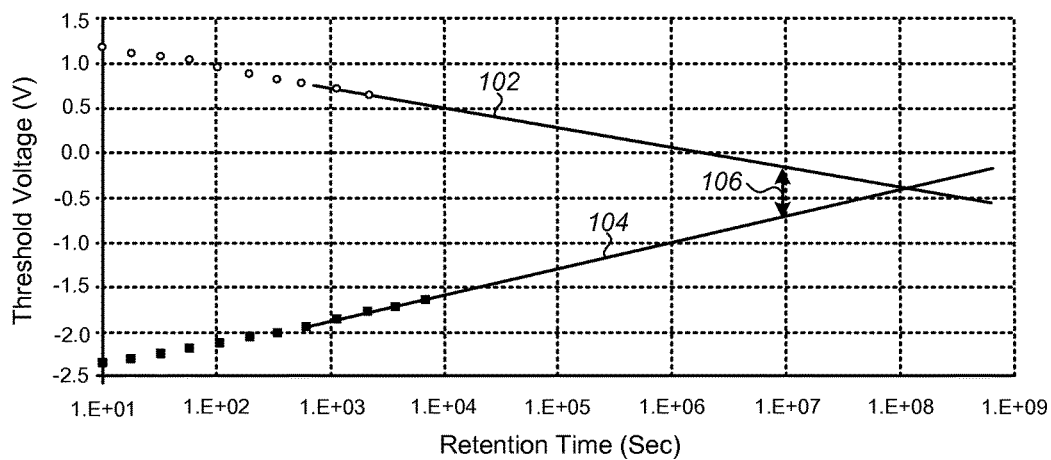
FIG. 1A is a graph showing data retention for a memory transistor using a charge storage layer formed according to a conventional method and having a large initial difference between programming and erase voltages but which loses charge quickly.
Figure 1B:
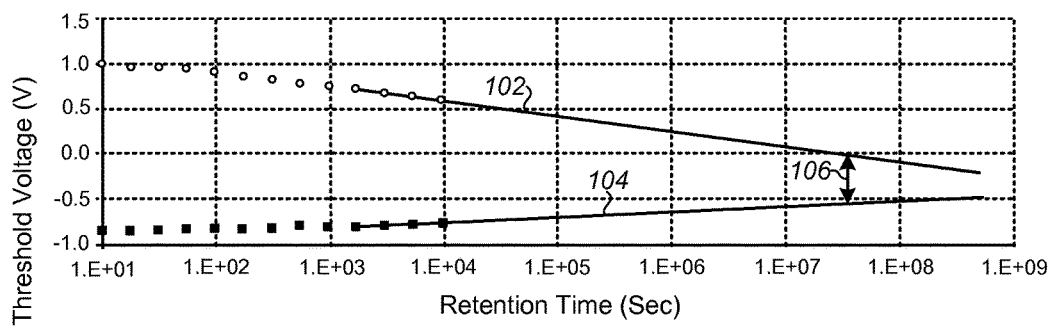
FIG. 1B is a graph showing data retention for a memory transistor using a charge storage layer formed according to a conventional method and having a smaller initial difference between programming and erase voltages.

The present invention is directed generally to non-volatile memory transistor including a multi-layer charge storage layer and high work function gate electrode to increase data retention and/or to improve programming time and efficiency. The structure and method are particularly useful for embedded memory or System-On-Chip (SOC) applications in which a semiconductor device includes both a logic transistor and non-volatile memory transistor comprising high work function gate electrodes formed on a common substrate.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, a non-volatile memory transistor according to the present invention includes a high work function gate electrode formed over an oxide-nitride-oxide (ONO) dielectric stack. By high work function gate electrode it is meant that the minimum energy needed to remove an electron from the gate electrode is increased.

In certain preferred embodiments, the high work function gate electrode comprises a doped polycrystalline silicon or polysilicon (poly) layer, the fabrication of which can be can be readily integrated into standard complementary metal-oxide-semiconductor (CMOS) process flows, such as those used fabricate metal-oxide-semiconductor (MOS) logic transistors, to enable fabrication of semiconductor memories or devices including both memory and logic transistors. More preferably, the same doped polysilicon layer can also be patterned to form a high work function gate electrode for the MOS logic transistor, thereby improving the performance of the logic transistor and increasing the efficiency of the fabrication process. Optionally, the ONO dielectric stack includes a multi-layer charge storage or charge trapping layer to further improve performance, and in particular data retention, of the memory transistor.

A semiconductor device including a non-volatile memory transistor comprising a high work function gate electrode and methods of forming the same will now be described in detail with reference to FIGS. 2A through 2D, which are partial cross-sectional side views of intermediate structures illustrating a process flow for forming a semiconductor device including both memory and logic transistors. For purposes of clarity, many of the details of semiconductor fabrication that are widely known and are not relevant to the present invention have been omitted from the following description.

Referring to FIG. 2, fabrication of the semiconductor device begins with formation of an ONO dielectric stack 202 over a surface 204 of a wafer or substrate 206. Generally, the ONO dielectric stack 202 includes a thin, lower oxide layer or tunneling oxide layer 208 that separates or electrically isolates a charge trapping or storage layer 210 from a channel region (not shown) of the memory transistor in the substrate 206, and a top or blocking oxide layer 212. Preferably, as noted above and as shown in FIGS. 2A-2D, the charge storage layer 210 is a multi-layer charge storage layer including at least a top, charge trapping oxynitride layer 210A and a lower, substantially trap free oxynitride layer 210B.

Generally, the substrate 206 may include any known silicon-based semiconductor material including silicon, silicon-germanium, silicon-on-insulator, or silicon-on-sapphire substrate. Alternatively, the substrate 206 may include a silicon layer formed on a non-silicon-based semiconductor material, such as gallium-arsenide, germanium, gallium-nitride, or aluminum-phosphide. Preferably, the substrate 206 is a doped or undoped silicon substrate.

The lower oxide layer or tunneling oxide layer 208 of the ONO dielectric stack 202 generally includes a relatively thin layer of silicon dioxide ($SiO_2$) of from about 15 angstrom (Å) to about 22 Å, and more preferably about 18 Å. The tunneling oxide layer 208 can be formed or deposited by any suitable means including, for example, being thermally grown or deposited using chemical vapor deposition (CVD). In a preferred embodiment, the tunnel dielectric layer is formed or grown using a steam anneal. Generally, the process includes a wet-oxidizing method in which the substrate 206 is placed in a deposition or processing chamber, heated to a temperature from about 700° C. to about 850° C., and exposed to a wet vapor for a predetermined period of time selected based on a desired thickness of the finished tunneling oxide layer 208. Exemplary process times are from about 5 to about 20 minutes. The oxidation can be performed at atmospheric or at low pressure.

In a preferred embodiment, the oxynitride layers 210A, 210B, of the multi-layer charge storage layer 210 are formed or deposited in separate steps utilizing different processes and process gases or source materials, and have an overall or combined thickness of from about 70 Å to about 150 Å, and more preferably about 100 Å. The lower, trap free oxynitride layer 210B can be formed or deposited by any suitable means including, for example, deposition in a low pressure CVD process using a process gas including a silicon source, such as silane ($SiH_4$), chlorosilane ($SiH_3Cl$), dichlorosilane ($SiH_2Cl_2$), tetrachlorosilane ($SiCl_4$), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. In one embodiment the trap free oxynitride layer 210B is deposited in a low pressure CVD process using a process gas including dichlorosilane, $NH_3$ and $N_2O$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm).

The top, charge trapping oxynitride layer 210A can be deposited over the bottom oxynitride layer 210B in a CVD process using a process gas including Bis-TertiaryButylAminoSilane (BTBAS). It has been found that the use of BTBAS increases the number of deep traps formed in the oxynitride by increasing the carbon level in the charge trapping oxynitride layer 210A. Moreover, these deep traps reduce charge losses due to thermal emission, thereby further improving data retention. More preferably, the process gas includes BTBAS and ammonia ($NH_3$) mixed at a predetermined ratio to provide a narrow band gap energy level in the oxynitride charge trapping layer. In particular, the process gas can include BTBAS and $NH_3$ mixed in a ratio of from about 7:1 to about 1:7. For example, in one embodiment the charge trapping oxynitride layer 210A is deposited in a low pressure CVD process using BTBAS and ammonia $NH_3$ at a chamber pressure of from about 5 mT to about 500 mT, and at a substrate temperature of from about 700° C. to about 850° C. and more preferably at least about 780° C., for a period of from about 2.5 minutes to about 20 minutes.

It has been found that an oxynitride layer produced or deposited under the above conditions yields a trap-rich oxynitride layer 210A, which improves the program and erase speed and increases of the initial difference (window) between program and erase voltages without compromising a charge loss rate of the memory transistor, thereby extending the operating life (EOL) of the device. Preferably, the charge trapping oxynitride layer 210A has a charge trap density of at least about $1E10/cm^2$, and more preferably from about $1E12/cm^2$ to about $1E14/cm^2$.

Alternatively, the charge trapping oxynitride layer 210A can be deposited over the bottom oxynitride layer 210B in a CVD process using a process gas including BTBAS and substantially not including ammonia ($NH_3$). In this alternative embodiment of the method, the step of depositing the top, charge trapping oxynitride layer 210A is followed by a thermal annealing step in a nitrogen atmosphere including nitrous oxide ($N_2O$), $NH_3$, and/or nitrogen oxide (NO).

Preferably, the top, charge trapping oxynitride layer 210A is deposited sequentially in the same CVD tool used to form the bottom, trap free oxynitride layer 210B, substantially without breaking vacuum on the deposition chamber. More preferably, the charge trapping oxynitride layer 210A is deposited substantially without altering the temperature to which the substrate 206 was heated during deposition of the trap free oxynitride layer 210B.

A suitable thickness for the lower, trap free oxynitride layer 210B has been found to be from about 10 Å to about 80 Å, and a ratio of thicknesses between the bottom layer and the top, charge trapping oxynitride layer has been found to be from about 1:6 to about 6:1, and more preferably at least about 1:4.

The top oxide layer 212 of the ONO dielectric stack 202 includes a relatively thick layer of $SiO_2$ of from about 20 Å to about 70 Å, and more preferably about 45 Å. The top oxide layer 212 can be formed or deposited by any suitable means including, for example, being thermally grown or deposited using CVD. In a preferred embodiment, the top oxide layer 212 is a high-temperature-oxide (HTO) deposited using CVD process. Generally, the deposition process includes exposing the substrate 306 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

Preferably, the top oxide layer 212 is deposited sequentially in the same tool used to form the oxynitride layers 210A, 210B. More preferably, the oxynitride layers 210A, 210B, and the top oxide layer 212 are formed or deposited in the same tool used to grow the tunneling oxide layer 208. Suitable tools include, for example, an ONO AVP, commercially available from AVIZA technology of Scotts Valley, Calif.

Figure 2A:
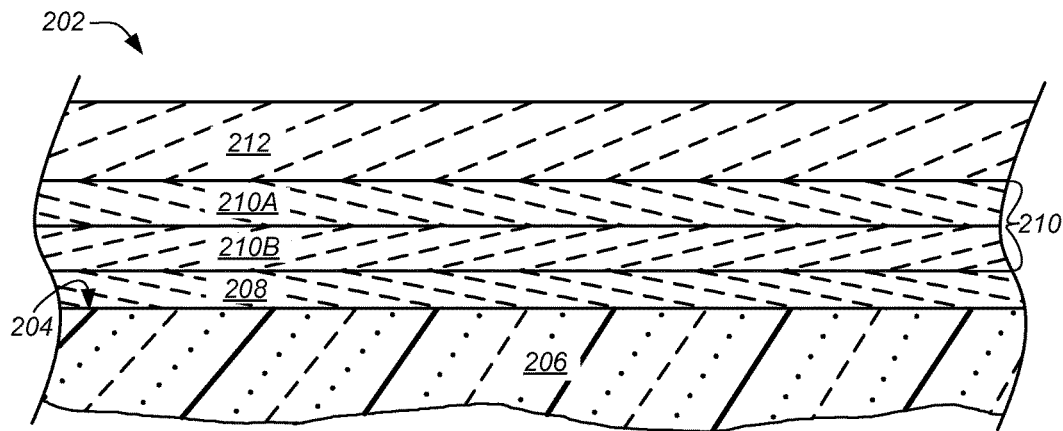
FIGS. 2A through 2D are partial cross-sectional side views of a semiconductor device illustrating a process flow for forming a semiconductor device including a logic transistor and non-volatile memory transistor according to an embodiment of the present invention.
Figure 2B:
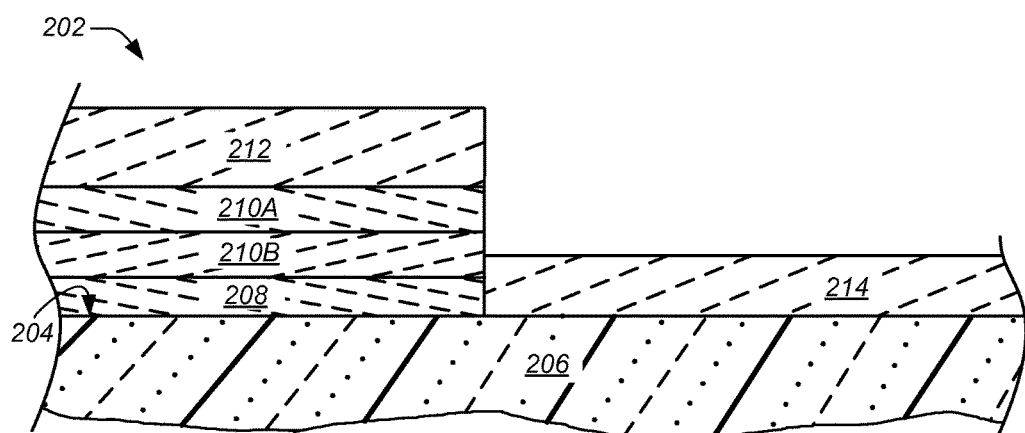

Referring to FIG. 2B, in those embodiments in which the semiconductor device is to further include a logic transistor, such as a MOS logic transistor, formed on the surface of the same substrate the ONO dielectric stack 202 is removed from a region or area of the surface 204 in which the logic transistor is to be formed, and an oxide layer 214 the formed thereon.

Generally, the ONO dielectric stack 202 is removed from the desired region or area of the surface 204 using standard photolithographic and oxide etch techniques. For example, in one embodiment a patterned mask layer (not shown) is formed from a photo-resist deposited on the ONO dielectric stack 202, and the exposed region etched or removed using a low pressure radiofrequency (RF) coupled or generated plasma comprising fluorinated hydrocarbon and/or fluorinated carbon compounds, such as $C_2H_2F_4$ commonly referred to as Freon®. Generally, the processing gas further includes argon (Ar) and nitrogen ($N_2$) at flow rates selected to maintain a pressure in the etch chamber of from about 50 mT to about 250 mT during processing.

The oxide layer 214 of the logic transistor can include a layer of $SiO_2$ having a thickness of from about 30 to about 70 Å, and can be thermally grown or deposited using CVD. In one embodiment, the oxide layer 214 is thermally grown using a steam oxidation process, for example, by maintaining the substrate 206 in a steam atmosphere at a temperature of from about 650° C. to about 850° C. for a period of from about 10 minutes to about 120 minutes.

Next, a doped polysilicon layer is formed on a surface of the ONO dielectric stack 202 and, preferably, the oxide layer 214 of the logic transistor. More preferably, the substrate 206 is a silicon substrate or has a silicon surface on which the ONO dielectric stack is formed to form a silicon-oxide-nitride-oxide-silicon (SONOS) gate stack of a SONOS memory transistor.

Figure 2C:
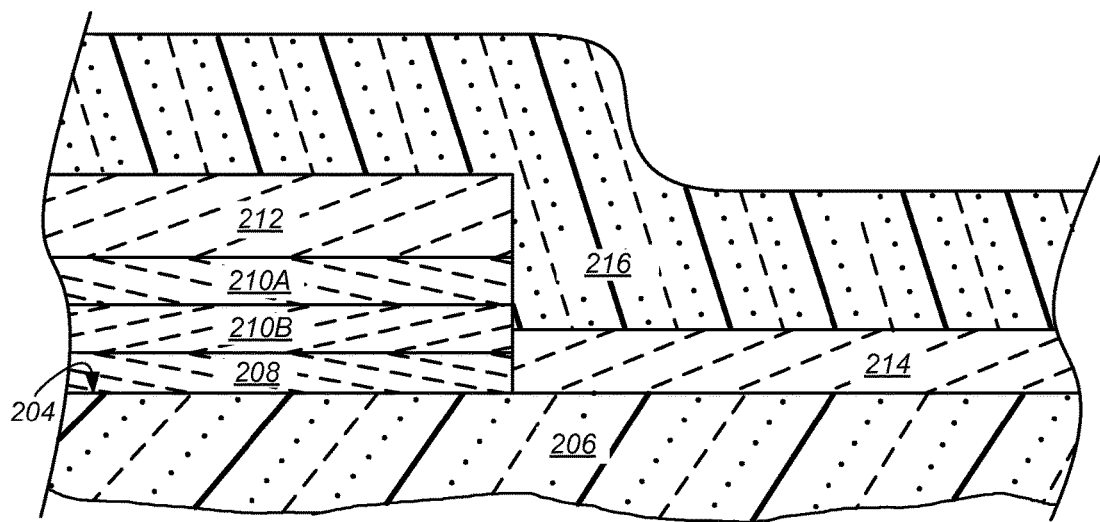

Referring to FIG. 2C, forming of the doped polysilicon layer begins with the deposition of a conformal polysilicon layer 216 having a thickness of from about 200 Å to about 2000 Å over the ONO dielectric stack 202 and the oxide layer 214. The polysilicon layer 216 can be formed or deposited by any suitable means including, for example, deposition in a low pressure CVD process using a silicon source or precursor. In one embodiment the polysilicon layer 216 is deposited in a low pressure CVD process using a silicon containing process gas, such as silane or dichlorosilane, and $N_2$, while maintaining the substrate 206 in a chamber at a pressure of from about 5 to 500 mT, and at a temperature of from about 600° C. to about 1000° C. for a period of from about 20 minutes to about 100 minutes to a substantially undoped polysilicon layer. The polysilicon layer 216 can be formed or grown directly as a doped polysilicon layer through the addition of gases such as phosphine, arsine, diborane or difluoroborane ($BF_2$) to the CVD chamber during the low pressure CVD process.

In one embodiment, the polysilicon layer 216 is doped following the growth or formation in the LPCVD process using ion implantation process. For example, the polysilicon layer 216 can be doped by implanting boron ($B^+$) or $BF_2$ ions at an energy of from about 5 to about 100 kilo-electron volts (keV), and a dose of from about 1e14 $cm^{-2}$ to about 1e16 $cm^{-2}$ to form an N-type (NMOS) SONOS memory transistor and, preferably, a P-type (PMOS) logic transistor having high work function gate electrodes. More preferably, the polysilicon layer 216 is doped to a concentration or dose selected so that the minimum energy needed to remove an electron from the gate electrode is from at least about 4.8 electron volts (eV) to about 5.3 eV.

Alternatively, the polysilicon layer 216 can be doped by ion implantation after patterning or etching the polysilicon layer and the underlying dielectric layers. It will be appreciated that this embodiment includes additional masking steps to protect exposed areas of the substrate 206 surface 204 and/or the dielectric layers from receiving undesired doping. However, generally such a masking step is included in existing process flows regardless of whether the implantation occurs before or after patterning.

Figure 2D:
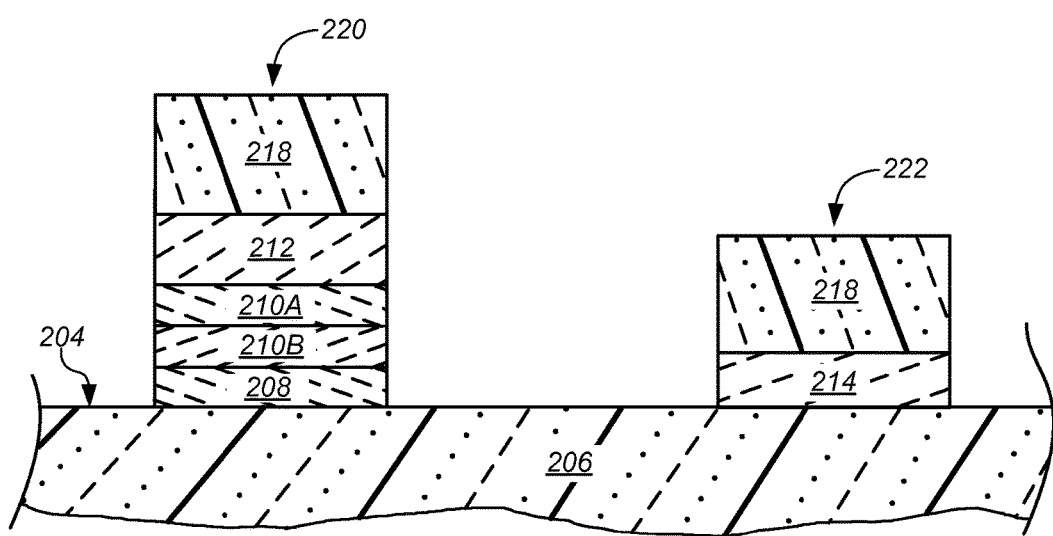

Referring to FIG. 2D, the polysilicon layer 216 and the underlying dielectric stack 202 and oxide layer 214 are patterned or etched to form high work function gate electrodes 218 of the memory transistor 220 and logic transistor 222. In one embodiment polysilicon layer 216 can be etched or patterned using a plasma comprising hydrobromic acid (HBr), chlorine ($CL_2$) and/or oxygen ($O_2$) at a pressure of about 25 mTorr, and a power of about 450 W. The oxide layers 208, 212, 214, and oxynitride layers 210A, 210B, can be etched using standard photolithographic and oxide etch techniques as described. For example, in one embodiment the patterned polysilicon layer 216 is used as a mask, and the exposed oxide layers 208, 212, 214, and oxynitride layers 210A, 210B, etched or removed using low pressure RF plasma. Generally, the plasma is formed from a processing gas comprising a fluorinated hydrocarbon and/or fluorinated carbon compounds, and further including Ar and $N_2$ at flow rates selected to maintain a pressure in the etch chamber of from about 50 mT to about 250 mT during processing.

Finally, the substrate is thermal annealed with a single or multiple annealing steps at a temperature of from about 800° C. to about 1050° C. for a time of from about 1 second to about 5 minutes to drive in ions implanted in the polysilicon layer 216, and to repair damage to the crystal structure of the polysilicon layer caused by ion implantation. Alternatively, advanced annealing techniques, such as flash and laser, can be employed with temperatures as high as 1350° C. and anneal times as low as 1 millisecond.

Figure 3:
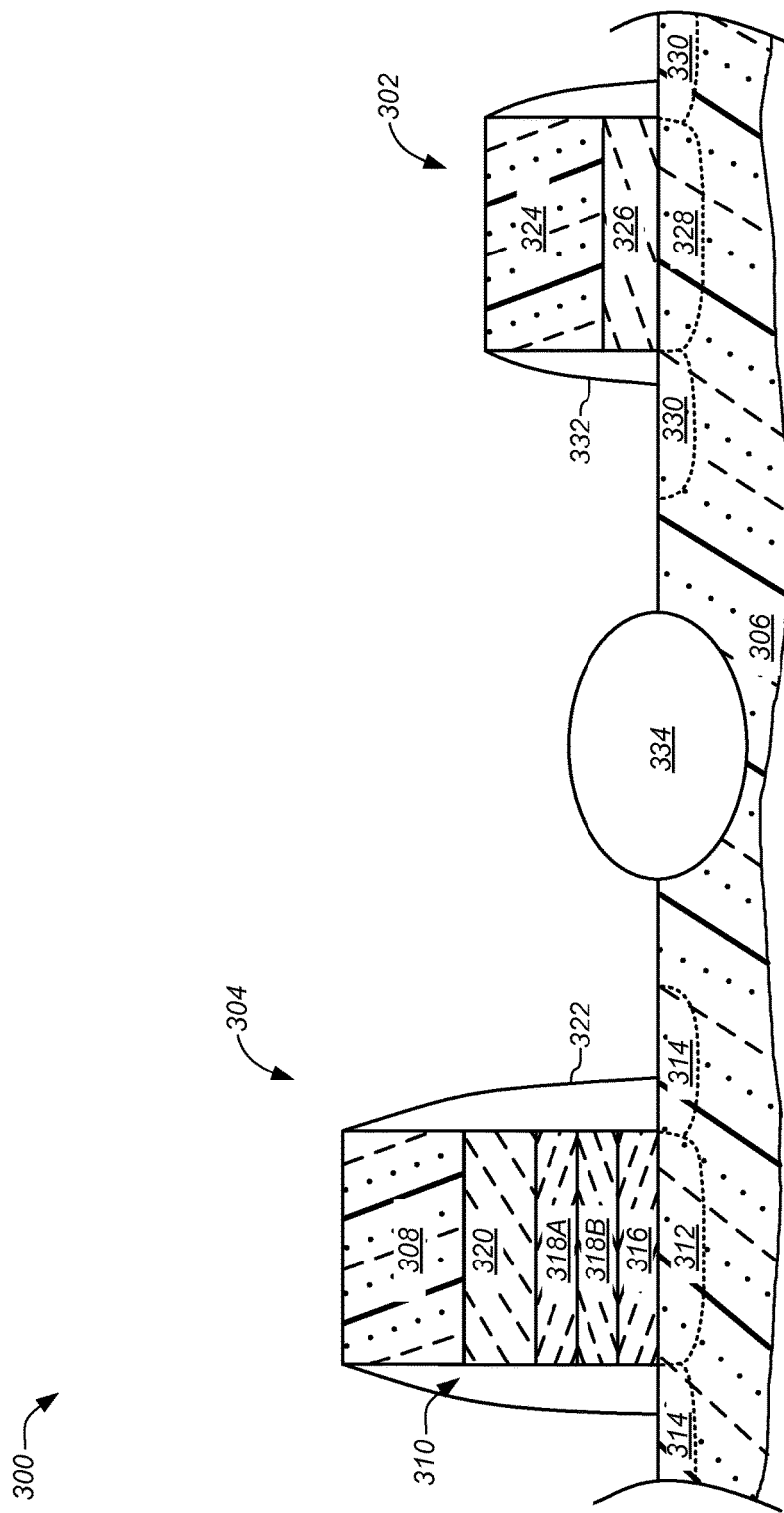
FIG. 3 is a partial cross-sectional side view of a semiconductor device including a logic transistor and non-volatile memory transistor comprising high work function gate electrodes according to an embodiment of the present invention.

A partial cross-sectional side view of a semiconductor device 300 including a logic transistor 302 and non-volatile memory transistor 304 comprising high work function gate electrodes according to an embodiment of the present invention is shown in FIG. 3. Referring to FIG. 3, the memory transistor 304 is formed on a silicon substrate 306 and comprises a high work function gate electrode 308 formed from a doped polysilicon layer overlying a dielectric stack 310. The dielectric stack 310 overlies and controls current through a channel region 312 separating heavily doped source and drain (S/D) regions 314. Preferably, the dielectric stack 310 includes a tunnel dielectric layer 316, a multi-layer charge storage layer 318A, 318B, and a top or blocking oxide layer 320. More preferably, the multi-layer charge storage layer 318A, 318B, includes at least a top, charge trapping oxynitride layer 318A and a lower, substantially trap free oxynitride layer 318B. Optionally, as shown in FIG. 3, the memory transistor 304 further includes one or more sidewall spacers 322 surrounding the gate stack to electrically insulate it from contacts (not shown) to the S/D regions 320 and from other transistors in the semiconductor device formed on the substrate 306.

The logic transistor 302 comprises a gate electrode 324 overlying an oxide layer 326 formed over a channel region 328 separating heavily doped source and drain regions 330, and, optionally, can include one or more sidewall spacers 332 surrounding the gate electrically insulate it from contacts (not shown) to the S/D regions. Preferably, as shown in FIG. 3, the gate electrode 324 of the logic transistor 302 also comprises a high work function gate electrode formed from a doped polysilicon layer.

Generally, the semiconductor device 300 further includes a number of isolation structures 334, such as a local oxidation of silicon (LOCOS) region or structure, a field oxidation region or structure (FOX), or a shallow trench isolation (STI) structure to electrically isolate individual transistors formed on the substrate 306 from one another.

Implementations and Alternatives

Figure 4A:
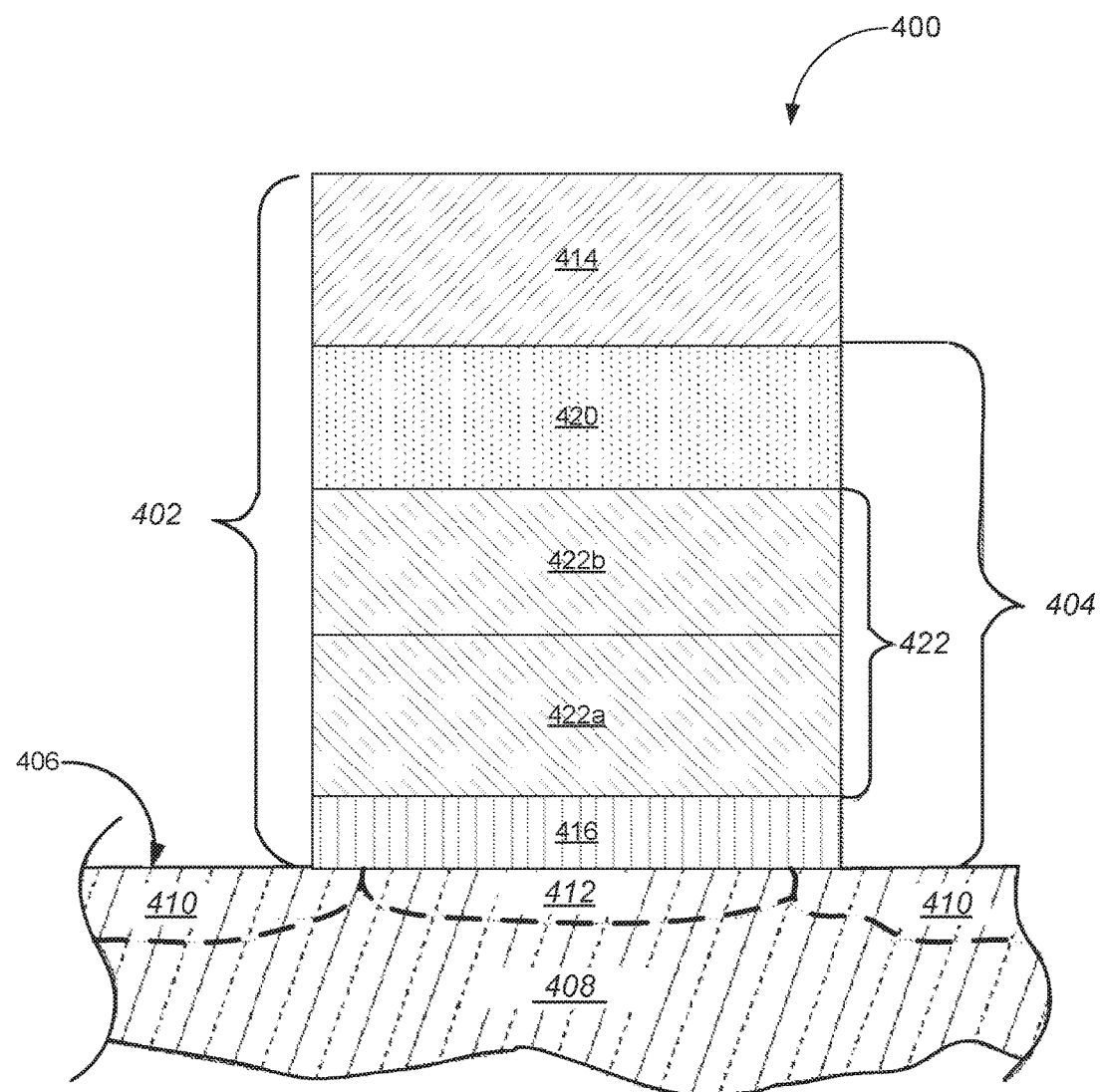
FIGS. 4A and 4B illustrates a cross-sectional view of a non-volatile memory device including an ONONO stack.

In one aspect the present disclosure is directed to semiconductor devices including memory transistors with a high work function gate electrode and a multi-layer charge-trapping region. FIG. 4A is a block diagram illustrating a cross-sectional side view of an embodiment of one such memory transistor 400. The memory transistor 400 includes a ONNO stack 402 including an ONNO structure 404 formed over a surface 406 of a substrate 408. Substrate 408 includes one or more diffusion regions 410, such as source and drain regions, aligned to the gate stack 402 and separated by a channel region 412. Generally, the ONNO stack 402 includes a high work function gate electrode 414 formed upon and in contact with the ONNO structure 404. The high work function gate electrode 414 is separated or electrically isolated from the substrate 408 by the ONNO structure 404. The ONNO structure 404 includes a thin, lower oxide layer or tunnel dielectric layer 416 that separates or electrically isolates the ONNO stack 402 from the channel region 412, a top or blocking dielectric layer 420, and a multi-layer charge-trapping region 422.

The nanowire channel region 412 can comprise polysilicon or recrystallized polysilicon to form a monocrystalline channel region. Optionally, where the channel region 412 includes a crystalline silicon, the channel region can be formed to have <100> surface crystalline orientation relative to a long axis of the channel region.

The high work function gate electrode 414 includes a doped polysilicon layer formed or deposited in a low pressure CVD process and having a thickness of from about 200 Å to about 2000 Å. As noted above, the polysilicon layer of the high work function gate electrode 414 can be formed or grown directly as a doped polysilicon layer through the addition of gases such as phosphine, arsine, diborane or difluoroborane ($BF_2$) to the CVD chamber during the low pressure CVD process, or can be doped following the growth or formation in the CVD process using an ion implantation process. In either embodiment, the polysilicon layer of the high work function gate electrode 414 is doped to a concentration or dose selected so that the minimum energy needed to remove an electron from the gate electrode is from at least about 4.8 electron volts (eV) to about 5.3 eV. In an exemplary embodiment, the polysilicon layer of the high work function gate electrode 414 is doped by implanting boron ($B^+$) or $BF_2$ ions at an energy of from about 5 to about 100 kilo-electron volts (keV), and a dose of from about 1e14 $cm^{-2}$ to about 1e16 $cm^{-2}$ to form an N-type (NMOS) memory transistor.

The tunnel dielectric layer 416 may be any material and have any thickness suitable to allow charge carriers to tunnel into the multi-layer charge-trapping region 422 under an applied gate bias while maintaining a suitable barrier to leakage when the memory transistor 400 is unbiased. In one embodiment, the tunnel dielectric layer 416 is formed by a thermal oxidation process and is composed of silicon dioxide or silicon oxy-nitride, or a combination thereof. In another embodiment, the tunnel dielectric layer 416 is formed by chemical vapor deposition (CVD) or atomic layer deposition (ALD) and is composed of a dielectric layer which may include, but is not limited to, silicon nitride, hafnium oxide, zirconium oxide, hafnium silicate, hafnium oxy-nitride, hafnium zirconium oxide and lanthanum oxide. In a specific embodiment, the tunnel dielectric layer 416 has a thickness in the range of 1-10 nanometers. In a particular embodiment, the tunnel dielectric layer 416 has a thickness of approximately 2 nanometers.

In one embodiment, the blocking dielectric layer 420 comprises a high temperature oxide (HTO). The higher quality HTO oxide enables the blocking dielectric layer 420 to be scaled in thickness. In an exemplary embodiment, the thickness of the blocking dielectric layer 420 comprising a HTO oxide is between 2.5 nm and 10.0 nm.

In another embodiment, the blocking dielectric layer 420 is further modified to incorporate nitrogen. In one such embodiment, the nitrogen is incorporated in the form of an ONO stack across the thickness of the blocking dielectric layer 420. Such a sandwich structure in place of the conventional pure oxygen blocking dielectric layer advantageously reduces the EOT of the entire stack 402 between the channel region 412 and high work function gate electrode 414 as well as enable tuning of band offsets to reduce back injection of carriers. The ONO stack blocking dielectric layer 420 can then be incorporated with the tunnel dielectric layer 416 and the multi-layer charge trapping layer 422 comprising an oxygen-rich first nitride layer 422a, an oxygen-lean second nitride layer 422b and an anti-tunneling layer 422c.

Figure 4B:
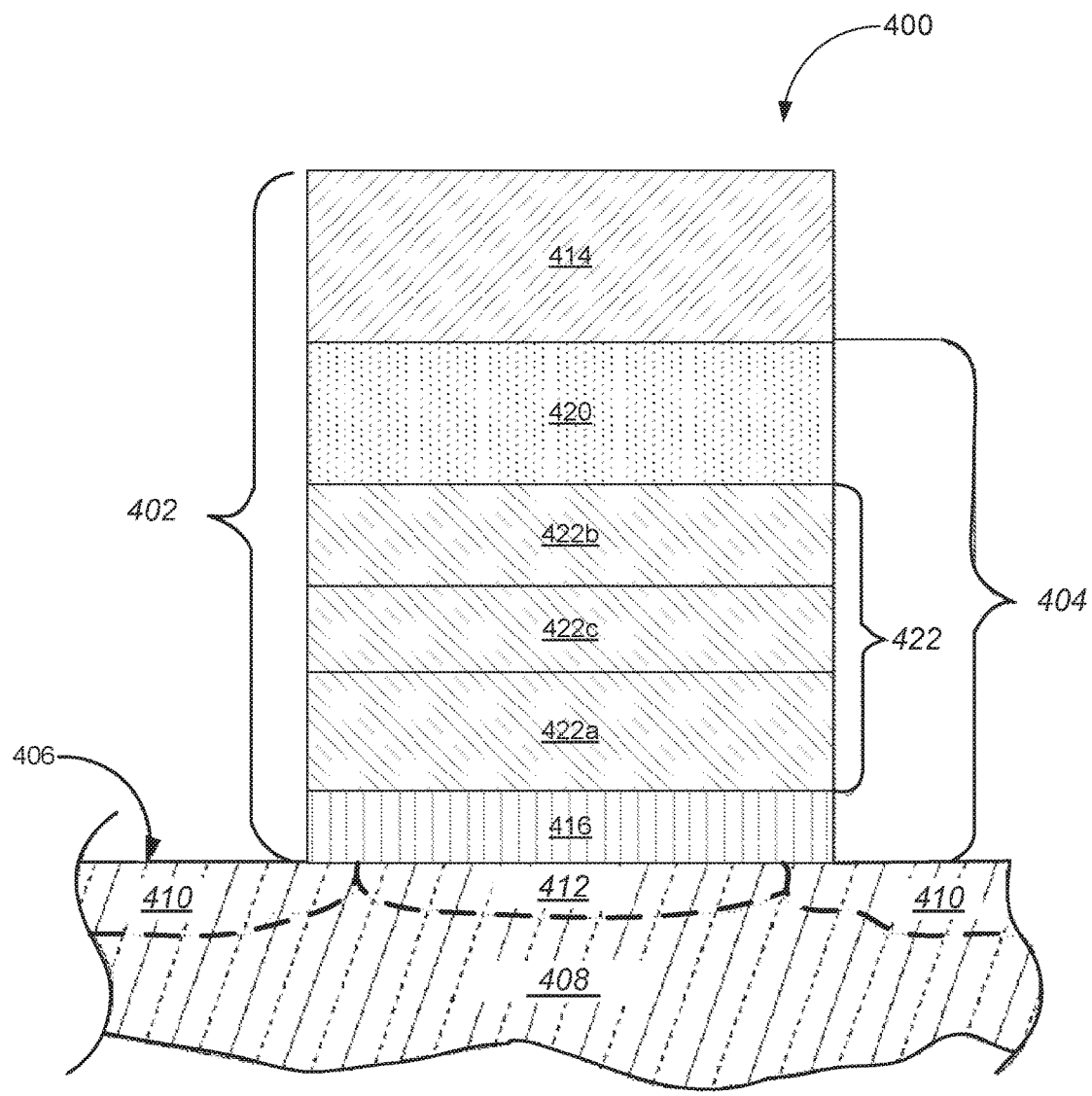

The multi-layer charge-trapping region 422 generally includes at least two nitride layers having differing compositions of silicon, oxygen and nitrogen, including an oxygen-rich, first nitride layer 422a, and a silicon-rich, nitrogen-rich, and oxygen-lean second nitride layer 422b, a silicon-rich. In some embodiments, such as that shown in FIG. 4B, the multi-layer charge-trapping region further includes an anti-tunneling layer 422c comprising an oxide, such as silicon dioxide, separating the oxygen-lean second nitride layer 422b from the oxygen-rich, first nitride layer 422a, to provide a ONONO stack 402 including an ONONO structure 404.

It has been found that an oxygen-rich, first nitride layer 422a decreases the charge loss rate after programming and after erase, which is manifested in a small voltage shift in the retention mode, while a silicon-rich, nitrogen-rich, and oxygen-lean second nitride layer 422b improves the speed and increases of the initial difference between program and erase voltage without compromising a charge loss rate of memory transistors made using an embodiment of the silicon-oxide-oxynitride-oxide-silicon structure, thereby extending the operating life of the device.

It has further been found that the anti-tunneling layer 422c substantially reduces the probability of electron charge that accumulates at the boundaries of the oxygen-lean second nitride layer 422b during programming from tunneling into the first nitride layer 422a, resulting in lower leakage current than for a conventional non-volatile memory transistor.

The multi-layer charge-trapping region can have an overall thickness of from about 50 Å to about 150 Å, and in certain embodiments less than about 100 Å, with the with the thickness of the anti-tunneling layer 422c being from about 5 Å to about 20 Å, and the thicknesses of the nitride layers 404b, 404a, being substantially equal.

A method or forming or fabricating a semiconductor device including a memory transistor with a high work function gate electrode and a multi-layer charge-trapping region according to one embodiment will now be described with reference to the flowchart of FIG. 5.

Figure 5:
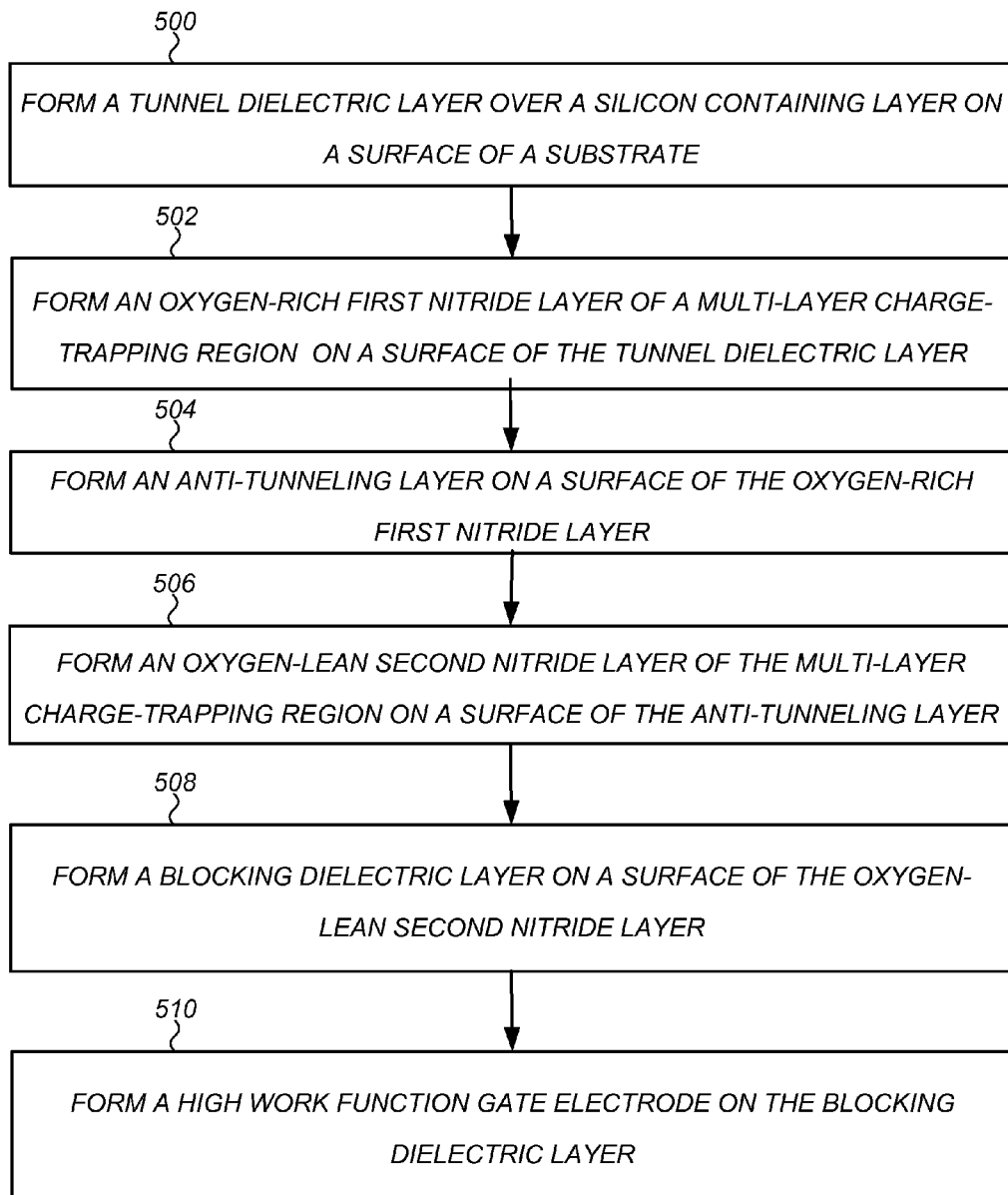
FIG. 5 depicts a flowchart representing a series of operations in a method for fabricating a non-volatile charge trap memory device including an ONONO stack, in accordance with an embodiment of the present invention.

Referring to FIG. 5, the method begins with forming a tunnel dielectric layer, such as a first oxide layer, over a silicon containing layer on a surface of a substrate (500). The tunnel dielectric layer can be formed or deposited by any suitable means, including a plasma oxidation process, In-Situ Steam Generation (ISSG) or a radical oxidation process. In one embodiment, the radical oxidation process involves flowing hydrogen (Hz) and oxygen ($O_2$) gas into a processing chamber or furnace to effect growth of a the tunnel dielectric layer by oxidation consumption of a portion of the substrate.

Next, an oxygen-rich first nitride layer of the multi-layer charge-trapping region is formed on a surface of the tunnel dielectric layer (502). In one embodiment, the oxygen-rich first nitride layer is formed or deposited in a low pressure CVD process using a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

For example, the lower or oxygen-rich first nitride layer can be deposited over the tunnel dielectric layer by placing the substrate in a deposition chamber and introducing a process gas including $N_2O$, $NH_3$ and DCS, while maintaining the chamber at a pressure of from about 5 milliTorr (mT) to about 500 mT, and maintaining the substrate at a temperature of from about 700 degrees Celsius to about 850 degrees Celsius and in certain embodiments at least about 760 degrees Celsius, for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich first nitride layer.

Next, an anti-tunneling layer is formed or deposited on a surface of the first nitride layer (504). As with the tunnel dielectric layer, the anti-tunneling layer can be formed or deposited by any suitable means, including a plasma oxidation process, In-Situ Steam Generation (ISSG) or a radical oxidation process. In one embodiment, the radical oxidation process involves flowing hydrogen ($H_2$) and oxygen ($O_2$) gas into a batch-processing chamber or furnace to effect growth of the anti-tunneling layer by oxidation consumption of a portion of the first nitride layer.

The top or oxygen-lean second nitride layer of the multi-layer charge-trapping region is then formed on a surface of the anti-tunneling layer (506). The oxygen-lean second nitride layer can be deposited over the anti-tunneling layer in a CVD process using a process gas including $N_2O$, $NH_3$ and DCS, at a chamber pressure of from about 5 mT to about 500 mT, and at a substrate temperature of from about 700 degrees Celsius to about 850 degrees Celsius and in certain embodiments at least about 760 degrees Celsius, for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that a nitride layer produced or deposited under these condition yields a silicon-rich, nitrogen-rich, and oxygen-lean second nitride layer, which improves the speed and increases of the initial difference between program and erase voltage without compromising a charge loss rate of memory transistors made using an embodiment of the silicon-oxide-oxynitride-oxide-silicon structure, thereby extending the operating life of the device.

In some embodiments, the oxygen-lean second nitride layer can be deposited over the anti-tunneling layer in a CVD process using a process gas including BTBAS and ammonia ($NH_3$) mixed at a ratio of from about 7:1 to about 1:7 to further include a concentration of carbon selected to increase the number of traps therein. The selected concentration of carbon in the second oxynitride layer can include a carbon concentration of from about 5% to about 15%.

Next, a top, blocking oxide layer or blocking dielectric layer is formed on a surface of the oxygen-lean second nitride layer of the multi-layer charge-trapping region (508). As with the tunnel dielectric layer and the anti-tunneling layer the blocking dielectric layer can be formed or deposited by any suitable means, including a plasma oxidation process, In-Situ Steam Generation (ISSG) or a radical oxidation process. In one embodiment, the blocking dielectric layer comprises a high-temperature-oxide (HTO) deposited using CVD process. Generally, the deposition process includes exposing the substrate 306 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

Alternatively, the blocking dielectric layer is formed using an ISSG oxidation process. In one embodiment, the ISSG is performed in an RTP chamber, such as the ISSG chamber from Applied Materials described above, at pressures of from about 8 to 12 Torr and a temperature of about 1050° C. with an oxygen rich gas mixture hydrogen to which from about 0.5% to 33% hydrogen has been added.

It will be appreciated that in either embodiment the thickness of the second nitride layer may be adjusted or increased as some of the oxygen-lean second nitride layer will be effectively consumed or oxidized during the process of forming the blocking dielectric layer.

Finally, a high work function gate electrode is formed upon and in contact with the blocking dielectric layer (510). The high work function gate electrode includes a doped polysilicon layer formed or deposited in a low pressure CVD process and having a thickness of from about 200 Å to about 2000 Å. As noted above, the polysilicon layer of the high work function gate electrode can be formed or grown directly as a doped polysilicon layer through the addition of gases such as phosphine, arsine, diborane or difluoroborane ($BF_2$) to the CVD chamber during the low pressure CVD process, or can be doped following the growth or formation in the CVD process using an ion implantation process. In either embodiment, the polysilicon layer of the high work function gate electrode is doped to a concentration or dose selected so that the minimum energy needed to remove an electron from the gate electrode is from at least about 4.8 electron volts (eV) to about 5.3 eV. In an exemplary embodiment, the polysilicon layer of the high work function gate electrode is doped by implanting boron ($B^+$) or $BF_2$ ions at an energy of from about 5 to about 100 kilo-electron volts (keV), and a dose of from about 1e14 $cm^{-2}$ to about 1e16 $cm^{-2}$ to form an N-type (NMOS) memory transistor.

With the completion of the gate stack fabrication, further processing may occur as known in the art to conclude fabrication of a SONOS-type memory device.

In another aspect the present disclosure is also directed to multigate or multigate-surface memory transistors including charge-trapping regions overlying two or more sides of a channel region formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel region, and a number of second layers are deposited thereover to form a second gate. A non-planar multigate device generally includes a horizontal or vertical channel region formed on or above a surface of a substrate and surrounded on three or more sides by a gate.

Figure 6A:
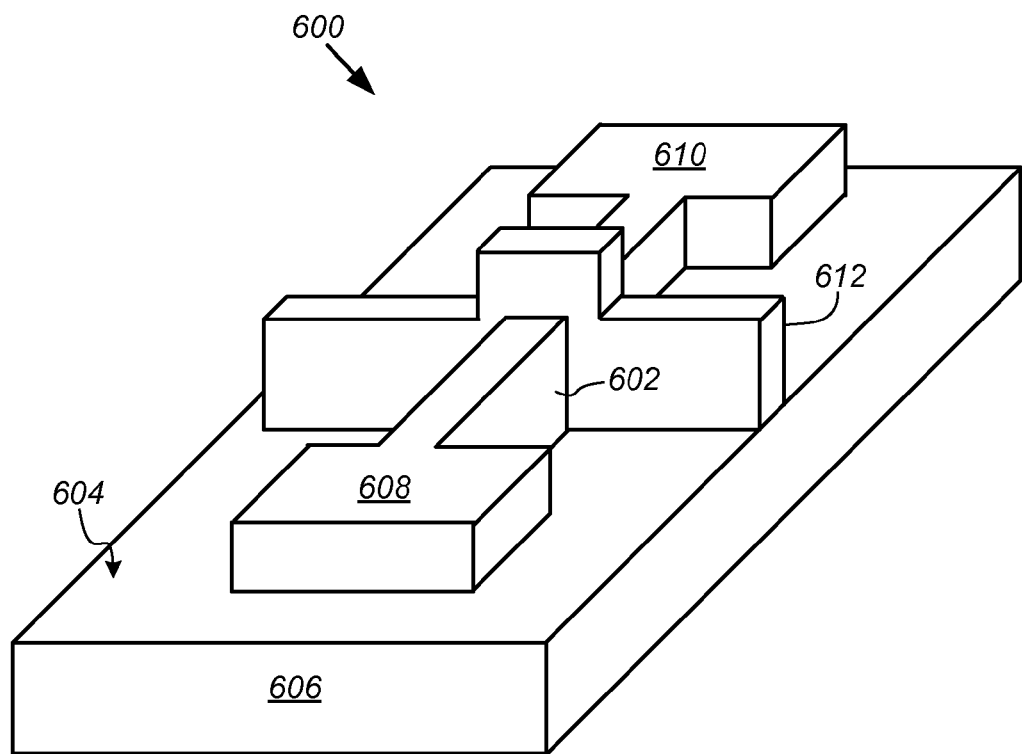
FIG. 6A illustrates a non-planar multigate device including a multi-layer charge-trapping region.

FIG. 6A illustrates one embodiment of a non-planar multigate memory transistor including with a high work function gate electrode. Referring to FIG. 6A, the memory transistor 600, commonly referred to as a finFET, includes a channel region 602 formed from a thin film or layer of semiconducting material overlying a surface 604 on a substrate 606 connecting a source region 608 and a drain region 610 of the memory transistor. The channel region 602 is enclosed on three sides by a fin which forms a gate 612 of the device. The thickness of the gate 612 (measured in the direction from source region to drain region) determines the effective channel region length of the device. As with the embodiments described above, the channel region 602 can comprise polysilicon or recrystallized polysilicon to form a monocrystalline channel region. Optionally, where the channel region 602 includes a crystalline silicon, the channel region can be formed to have <100> surface crystalline orientation relative to a long axis of the channel region.

Figure 6B:
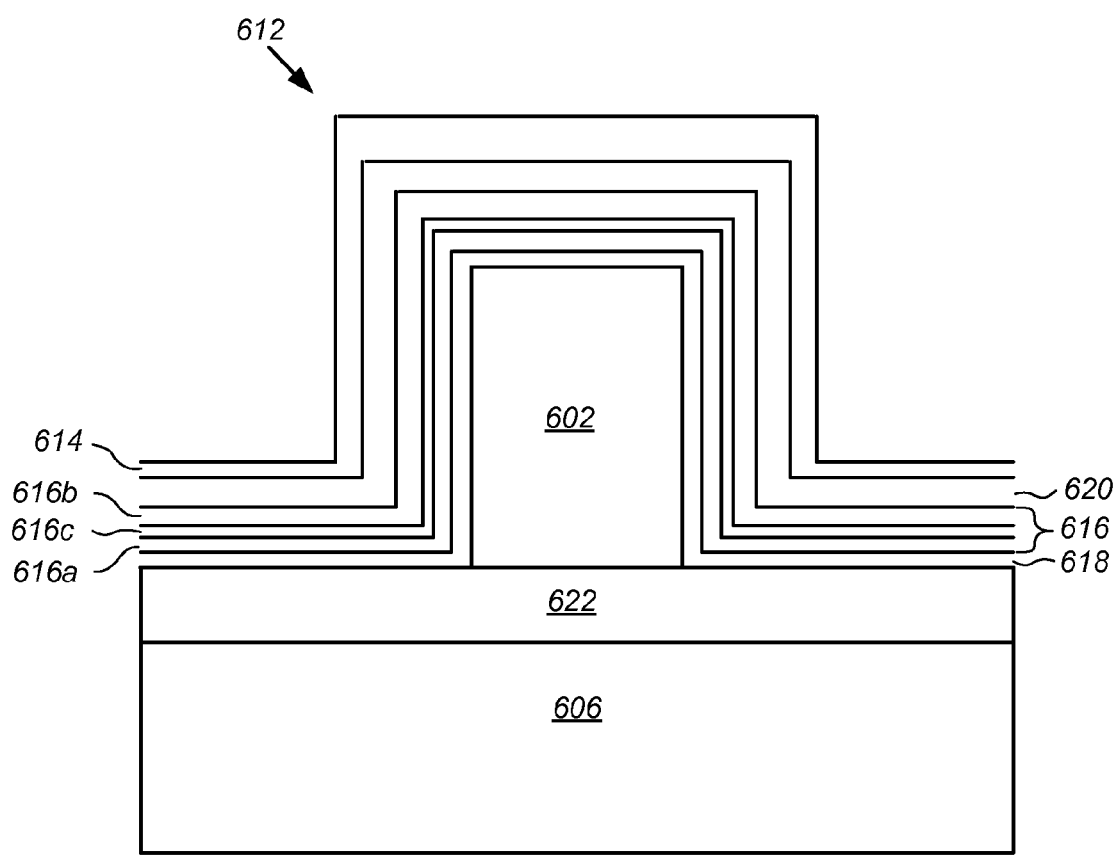
FIG. 6B illustrates a cross-sectional view of the non-planar multigate device of FIG. 6A.

In accordance with the present disclosure, the non-planar multigate memory transistor 600 of FIG. 6A can include a high work function gate electrode and a multi-layer charge-trapping region. FIG. 6B is a cross-sectional view of a portion of the non-planar memory transistor of FIG. 6A including a portion of the substrate 606, channel region 602 and the gate 612 illustrating a high work function gate electrode 614 and a multi-layer charge-trapping region 616. The gate 612 further includes a tunnel dielectric layer 618 overlying a raised channel region 602, and a blocking dielectric layer 620 overlying the blocking dielectric layer to form a control gate of the memory transistor 600. The channel region 602 and gate 612 can be formed directly on substrate 606 or on an insulating or dielectric layer 622, such as a buried oxide layer, formed on or over the substrate.

As with the embodiments described above, the high work function gate electrode 614 includes a doped polysilicon layer formed or deposited in a low pressure CVD process and having a thickness of from about 200 Å to about 2000 Å. The polysilicon layer of the high work function gate electrode 614 can be formed or grown directly as a doped polysilicon layer through the addition of gases such as phosphine, arsine, diborane or $BF_2$, and is doped to a concentration or dose selected so that the minimum energy needed to remove an electron from the gate electrode is from at least about 4.8 eV to about 5.3 eV. In an exemplary embodiment, the polysilicon layer of the high work function gate electrode 614 is doped to a concentration of from about 1e14 $cm^{-2}$ to about 1e16 $cm^{-2}$.

Referring to FIG. 6B, the multi-layer charge-trapping region 616 includes at least one lower or bottom oxygen-rich first nitride layer 616a including nitride closer to the tunnel dielectric layer 618, and an upper or top oxygen-rich second nitride layer 616b overlying the oxygen-rich first nitride layer. Generally, the oxygen-lean second nitride layer 616b includes a silicon-rich, oxygen-lean nitride layer and includes a majority of a charge traps distributed in the multi-layer charge-trapping region, while the oxygen-rich first nitride layer 616a includes an oxygen-rich nitride or silicon oxynitride, and is oxygen-rich relative to the oxygen-lean second nitride layer to reduce the number of charge traps therein. By oxygen-rich it is meant wherein a concentration of oxygen in the oxygen-rich first nitride layer 616a is from about 15 to about 40%, whereas a concentration of oxygen in oxygen-lean second nitride layer 616b is less than about 5%.

In one embodiment, the blocking dielectric 620 also includes an oxide, such as an HTO, to provide an ONNO structure. The channel region 602 and the overlying ONNO structure can be formed directly on a silicon substrate 606 and overlaid with a high work function gate electrode 614 to provide a SONNOS structure.

In some embodiments, such as that shown in FIG. 6B, the multi-layer charge-trapping region 616 further includes at least one thin, intermediate or anti-tunneling layer 616c including a dielectric, such as an oxide, separating the oxygen-lean second nitride layer 616b from the oxygen-rich first nitride layer 616a. As noted above, the anti-tunneling layer 616c substantially reduces the probability of electron charge that accumulates at the boundaries of the oxygen-lean second nitride layer 616b during programming from tunneling into the first nitride layer 616a.

As with the embodiments described above, either or both of the oxygen-rich first nitride layer 616a and the oxygen-lean second nitride layer 616b can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The oxygen-lean second nitride layer 616b has a stoichiometric composition of oxygen, nitrogen and/or silicon different from that of the oxygen-rich first nitride layer 616a, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 616c including oxide, the anti-tunneling layer can be formed by oxidation of the bottom oxynitride layer, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments including a blocking dielectric 620 including oxide the oxide may be formed or deposited by any suitable means. In one embodiment the oxide of the blocking dielectric 620 is a high temperature oxide deposited in a HTO CVD process. Alternatively, the blocking dielectric 620 or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the second nitride layer to a chosen depth using radical oxidation.

A suitable thickness for the oxygen-rich first nitride layer 616a may be from about 30 Å to about 160 Å (with some variance permitted, for example ±10 A), of which about 5-20 Å may be consumed by radical oxidation to form the anti-tunneling layer 616c. A suitable thickness for the oxygen-lean second nitride layer 616b may be at least 30 Å. In certain embodiments, the oxygen-lean second nitride layer 616b may be formed up to 130 Å thick, of which 30-70 Å may be consumed by radical oxidation to form the blocking dielectric 620. A ratio of thicknesses between the oxygen-rich first nitride layer 616a and oxygen-lean second nitride layer 616b is approximately 1:1 in some embodiments, although other ratios are also possible.

In other embodiments, either or both of the oxygen-lean second nitride layer 616b and the blocking dielectric 620 may include a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

In another embodiment, shown in FIGS. 7A and 7B, the memory transistor can include a nanowire channel region formed from a thin film of semiconducting material overlying a surface on a substrate connecting a source region and a drain region of the memory transistor. By nanowire channel region it is meant a conducting channel region formed in a thin strip of crystalline silicon material, having a maximum cross-sectional dimension of about 10 nanometers (nm) or less, and more preferably less than about 6 nm.

Referring to FIG. 7A, the memory transistor 700 includes a horizontal nanowire channel region 702 formed from a thin film or layer of semiconducting material on or overlying a surface on a substrate 706, and connecting a source region 708 and a drain region 710 of the memory transistor. In the embodiment shown, the device has a gate-all-around (GAA) structure in which the nanowire channel region 702 is enclosed on all sides by a gate 712 of the device. The thickness of the gate 712 (measured in the direction from source region to drain region) determines the effective channel region length of the device. As with the embodiments described above, the nanowire channel region 702 can comprise polysilicon or recrystallized polysilicon to form a monocrystalline channel region. Optionally, where the channel region 702 includes a crystalline silicon, the channel region can be formed to have <100> surface crystalline orientation relative to a long axis of the channel region.

In accordance with the present disclosure, the non-planar multigate memory transistor 700 of FIG. 7A can include a high work function gate electrode and a multi-layer charge-trapping region. FIG. 7B is a cross-sectional view of a portion of the non-planar memory transistor of FIG. 7A including a portion of the substrate 706, nanowire channel region 702 and the gate 712 illustrating a high work function gate electrode 714 and a multi-layer charge-trapping region 716a-716c. Referring to FIG. 7B, the gate 712 further includes a tunnel dielectric layer 718 overlying the nanowire channel region 702, and a blocking dielectric layer 720.

As with the embodiments described above, the high work function gate electrode 714 includes a doped polysilicon layer formed or deposited in a low pressure CVD process and having a thickness of from about 200 Å to about 2000 Å. The polysilicon layer of the high work function gate electrode 714 can be formed or grown directly as a doped polysilicon layer through the addition of gases such as phosphine, arsine, diborane or $BF_2$, and is doped to a concentration or dose selected so that the minimum energy needed to remove an electron from the gate electrode is from at least about 4.8 eV to about 5.3 eV. In an exemplary embodiment, the polysilicon layer of the high work function gate electrode 714 is doped to a concentration of from about 1e14 $cm^{-2}$ to about 1e16 $cm^{-2}$.

The multi-layer charge-trapping region 716a-716c includes at least one inner oxygen-rich first nitride layer 716a comprising nitride closer to the tunnel dielectric layer 718, and an outer oxygen-lean second nitride layer 716b overlying the oxygen-rich first nitride layer. Generally, the outer oxygen-lean second nitride layer 716b comprises a silicon-rich, oxygen-lean nitride layer and comprises a majority of a charge traps distributed in the multi-layer charge-trapping region, while the oxygen-rich first nitride layer 716a comprises an oxygen-rich nitride or silicon oxynitride, and is oxygen-rich relative to the outer oxygen-lean second nitride layer to reduce the number of charge traps therein.

In some embodiments, such as that shown, the multi-layer charge-trapping region 716 further includes at least one thin, intermediate or anti-tunneling layer 716c comprising a dielectric, such as an oxide, separating outer oxygen-lean second nitride layer 716b from the oxygen-rich first nitride layer 716a. The anti-tunneling layer 716c substantially reduces the probability of electron charge that accumulates at the boundaries of outer oxygen-lean second nitride layer 716b during programming from tunneling into the oxygen-rich first nitride layer 716a, resulting in lower leakage current.

As with the embodiment described above, either or both of the oxygen-rich first nitride layer 716a and the outer oxygen-lean second nitride layer 716b can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The outer oxygen-lean second nitride layer 716b has a stoichiometric composition of oxygen, nitrogen and/or silicon different from that of the oxygen-rich first nitride layer 716a, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 716c comprising oxide, the anti-tunneling layer can be formed by oxidation of the oxygen-rich first nitride layer 716a, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments in which the blocking dielectric 720 comprises oxide, the oxide may be formed or deposited by any suitable means. In one embodiment the oxide of blocking dielectric layer 720 is a high temperature oxide deposited in a HTO CVD process. Alternatively, the blocking dielectric layer 720 or blocking oxide layer may be thermally grown, however it will be appreciated that in this embodiment the thickness of the outer oxygen-lean second nitride layer 716b may need to be adjusted or increased as some of the top nitride will be effectively consumed or oxidized during the process of thermally growing the blocking oxide layer.

A suitable thickness for the oxygen-rich first nitride layer 716a may be from about 30 Å to about 80 Å (with some variance permitted, for example ±10 Å), of which about 5-20 Å may be consumed by radical oxidation to form the anti-tunneling layer 716c. A suitable thickness for the outer oxygen-lean second nitride layer 716b may be at least 30 Å. In certain embodiments, the outer oxygen-lean second nitride layer 716b may be formed up to 70 Å thick, of which 30-70 Å may be consumed by radical oxidation to form the blocking dielectric layer 720. A ratio of thicknesses between the oxygen-rich first nitride layer 716a and the outer oxygen-lean second nitride layer 716b is approximately 1:1 in some embodiments, although other ratios are also possible.

In other embodiments, either or both of the outer oxygen-lean second nitride layer 716b and the blocking dielectric layer 720 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

FIG. 7C illustrates a cross-sectional view of a vertical string of non-planar multigate devices 700 of FIG. 7A arranged in a Bit-Cost Scalable or BiCS architecture 726.

The architecture 726 consists of a vertical string or stack of non-planar multigate devices 700, where each device or cell includes a channel region 702 overlying the substrate 706, and connecting a source region and a drain region (not shown in this figure) of the memory transistor, and having a gate-all-around (GAA) structure in which the nanowire channel region 702 is enclosed on all sides by a gate 712. The BiCS architecture reduces number of critical lithography steps compared to a simple stacking of layers, leading to a reduced cost per memory bit.

In another embodiment, the memory transistor is or includes a non-planar device comprising a vertical nanowire channel region formed in or from a semiconducting material projecting above or from a number of conducting, semiconducting layers on a substrate. In one version of this embodiment, shown in cut-away in FIG. 8A, the memory transistor 800 comprises a vertical nanowire channel region 802 formed in a cylinder of semiconducting material connecting a source region 804 and drain region 806 of the device. The channel region 802 is surrounded by a tunnel dielectric layer 808, a multi-layer charge-trapping region 810, a blocking dielectric layer 812 and a high work function gate electrode 814 overlying the blocking dielectric layer to form a control gate of the memory transistor 800. The channel region 802 can include an annular region in an outer layer of a substantially solid cylinder of semiconducting material, or can include an annular layer formed over a cylinder of dielectric filler material. As with the horizontal nanowires described above, the channel region 802 can comprise polysilicon or recrystallized polysilicon to form a monocrystalline channel region. Optionally, where the channel region 802 includes a crystalline silicon, the channel region can be formed to have <100> surface crystalline orientation relative to a long axis of the channel region.

As with the embodiments described above, the high work function gate electrode 814 includes a doped polysilicon layer formed or deposited in a low pressure CVD process and having a thickness of from about 200 Å to about 2000 Å. The polysilicon layer of the high work function gate electrode 814 can be formed or grown directly as a doped polysilicon layer through the addition of gases such as phosphine, arsine, diborane or $BF_2$, and is doped to a concentration or dose selected so that the minimum energy needed to remove an electron from the gate electrode is from at least about 4.8 eV to about 5.3 eV. In an exemplary embodiment, the polysilicon layer of the high work function gate electrode 814 is doped to a concentration of from about $1e14$ $cm^{-2}$ to about $1e16$ $cm^{-2}$.

Figure 8A:
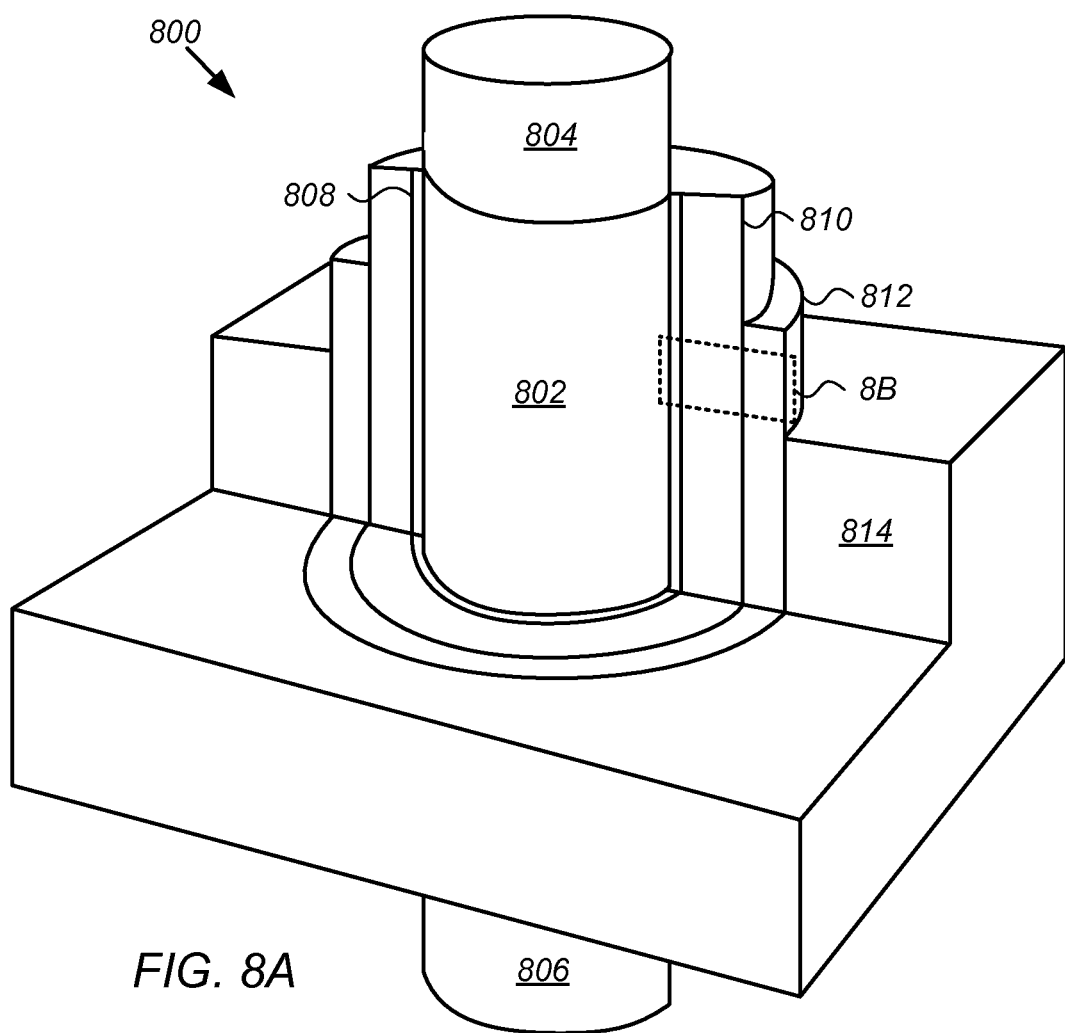
FIGS. 8A and 8B illustrate a non-planar multigate device including a multi-layer charge-trapping region and a vertical nanowire channel.
Figure 8B:
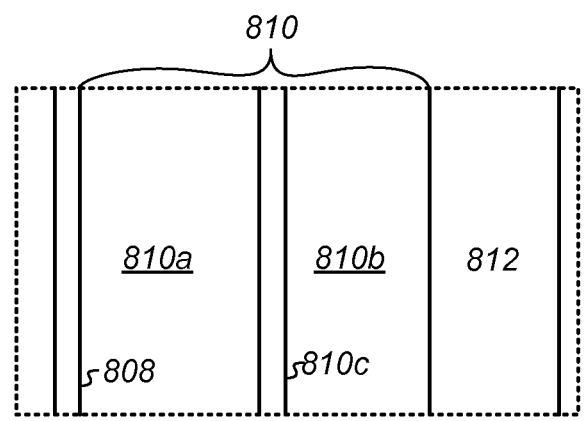

In some embodiments, such as that shown in FIG. 8B, the multi-layer charge-trapping region 810 includes at least an inner or oxygen-rich first nitride layer 810a closest to the tunnel dielectric layer 808, and an outer or oxygen-lean second nitride layer 810b. Optionally, as in the embodiment shown, the oxygen-rich first nitride layer 810a and the oxygen-lean second nitride layer 810b are separated by an intermediate oxide or anti-tunneling layer 810c comprising oxide.

Either or both of the oxygen-rich first nitride layer 810a and the oxygen-lean second nitride layer 810b can comprise silicon nitride or silicon oxynitride, and can be formed, for example, by a CVD process including $N_2O/NH_3$ and DCS/$NH_3$ gas mixtures in ratios and at flow rates tailored to provide a silicon-rich and oxygen-rich oxynitride layer.

Finally, either or both of the oxygen-lean second nitride layer 810b and the blocking dielectric layer 812 may comprise a high K dielectric, such as HfSiON, HfSiO, HfO, ZrSiON, ZrSiO, ZrO, or $Y_2O_3$.

A suitable thickness for the oxygen-rich first nitride layer 810a may be from about 30 Å to about 80 Å (with some variance permitted, for example ±10 Å), of which about 5-20 Å may be consumed by radical oxidation to form the anti-tunneling layer 820. A suitable thickness for the oxygen-lean second nitride layer 810b may be at least 30 Å, and a suitable thickness for the blocking dielectric layer 812 may be from about 30-70 Å.

The memory transistor 800 of FIG. 8A can be made using either a gate first or a gate last scheme. FIGS. 9A-F illustrate a gate first scheme for fabricating the non-planar multigate device of FIG. 8A. FIGS. 10A-F illustrate a gate last scheme for fabricating the non-planar multigate device of FIG. 8A.

Figure 9A:
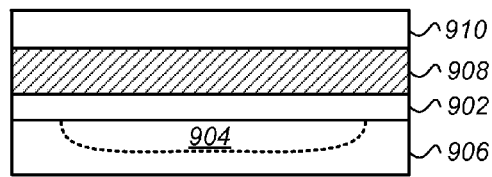
FIGS. 9A through 9F illustrate a gate first scheme for fabricating the non-planar multigate device of FIG. 8A.

Referring to FIG. 9A, in a gate first scheme a first or lower dielectric layer 902, such as an oxide, is formed over a first, doped diffusion region 904, such as a source region or a drain region, in a substrate 906. A high work function gate electrode 908 is formed over the first dielectric layer 902 to form a control gate of the device, and a second or upper dielectric layer 910 formed thereover. As with embodiments described above, the high work function gate electrode 908 can be formed by depositing and/or doping polysilicon layer having a thickness of from about 200 Å to about 2000 Å and a dopant concentration of from about $1e14$ $cm^{-2}$ to about $1e16$ $cm^{-2}$ so that the minimum energy needed to remove an electron from the gate electrode is from at least about 4.8 eV to about 5.3 eV. The polysilicon layer can be deposited in a low pressure CVD process as a doped polysilicon layer through the addition of gases such as phosphine, arsine, diborane or $BF_2$, or can be doped using an ion implantation process following deposition.

The first and second dielectric layers 902, 910, can be deposited by CVD, radical oxidation or be formed by oxidation of a portion of the underlying layer or substrate. Generally the thickness of the high work function gate electrode 908 is from about 40-50 Å, and the first and second dielectric layers 902, 910, from about 20-80 Å.

Figure 9B:
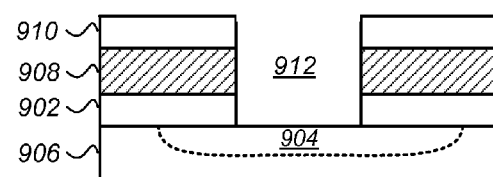
Figure 9C:
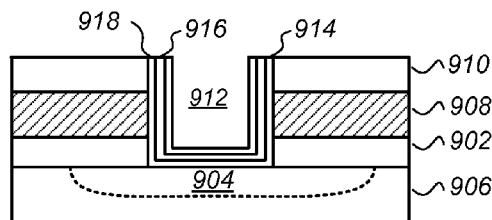

Referring to FIG. 9B, a first opening 912 is etched through the overlying high work function gate electrode 908, and the first and second dielectric layers 902, 910, to the diffusion region 904 in the substrate 906. Next, layers of a tunneling oxide 914, charge-trapping region 916, and blocking dielectric 918 are sequentially deposited in the opening and the surface of the upper dielectric layer 910 planarized to yield the intermediate structure shown in FIG. 9C.

Although not shown, it will be understood that as in the embodiments described above the charge-trapping region 916 can include a multi-layer charge-trapping region comprising at least one lower or oxygen-rich first nitride layer closer to the tunnel dielectric layer 914, and an upper or oxygen-lean second nitride layer overlying the oxygen-rich first nitride layer. Generally, the oxygen-lean second nitride layer comprises a silicon-rich, oxygen-lean nitride layer and comprises a majority of a charge traps distributed in the multi-layer charge-trapping region, while the oxygen-rich first nitride layer comprises an oxygen-rich nitride or silicon oxynitride, and is oxygen-rich relative to the oxygen-lean second nitride layer to reduce the number of charge traps therein. In some embodiments, the multi-layer charge-trapping region 916 further includes at least one thin, intermediate or anti-tunneling layer comprising a dielectric, such as an oxide, separating the oxygen-lean second nitride layer from the oxygen-rich first nitride layer.

Figure 9D:
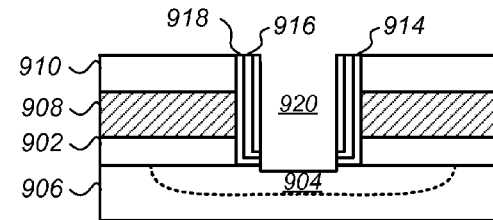
Figure 9E:
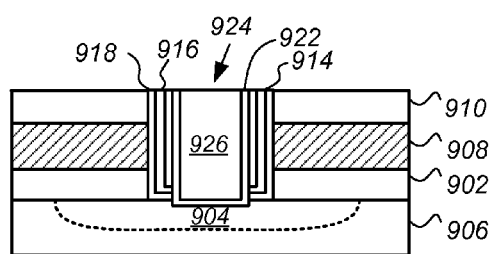

Next, a second or channel region opening 920 is anisotropically etched through tunneling oxide 914, charge-trapping region 916, and blocking dielectric 918, FIG. 9D. Referring to FIG. 9E, a semiconducting material 922 is deposited in the channel region opening to form a vertical channel region 924 therein. The vertical channel region 924 can include an annular region in an outer layer of a substantially solid cylinder of semiconducting material, or, as shown in FIG. 9E, can include a separate, layer semiconducting material 922 surrounding a cylinder of dielectric filler material 926.

Figure 9F:
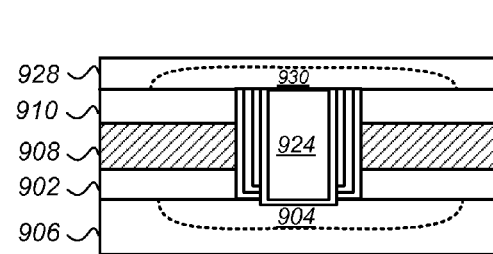

Referring to FIG. 9F, the surface of the upper dielectric layer 910 is planarized and a layer of semiconducting material 928 including a second, doped diffusion region 930, such as a source region or a drain region, formed therein deposited over the upper dielectric layer to form the device shown.

Figure 10A:
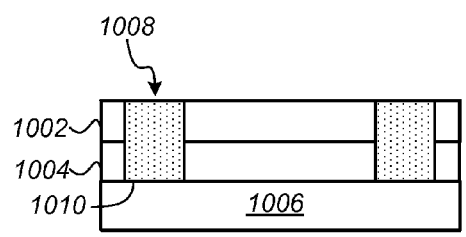
FIGS. 10A through 10F illustrate a gate last scheme for fabricating the non-planar multigate device of FIG. 8A.

Referring to FIG. 10A, in a gate last scheme a dielectric layer 1002, such as an oxide, is formed over a sacrificial layer 1004 on a surface on a substrate 1006, an opening etched through the dielectric and sacrificial layers and a vertical channel region 1008 formed therein. As with embodiments described above, the vertical channel region 1008 can include an annular region in an outer layer of a substantially solid cylinder of semiconducting material 1010, such as polycrystalline or monocrystalline silicon, or can include a separate, layer semiconducting material surrounding a cylinder of dielectric filler material (not shown). The dielectric layer 1002 can comprise any suitable dielectric material, such as a silicon oxide, capable of electrically isolating the subsequently formed high work function gate electrode of the memory transistor 800 from an overlying electrically active layer or another memory transistor.

Figure 10B:
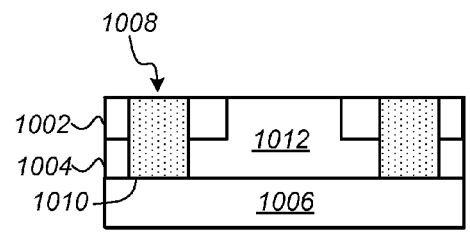

Referring to FIG. 10B, a second opening 1012 is etched through the etched through the dielectric and sacrificial layers 1002, 1004, to the substrate 1006, and the sacrificial layer 1004 at least partially etched or removed. The sacrificial layer 1004 can comprise any suitable material that can be etched or removed with high selectivity relative to the material of the dielectric layer 1002, substrate 1006 and vertical channel region 1008. In one embodiment the sacrificial layer 1004 comprises an oxide that can be removed by Buffered Oxide Etch (BOE etch).

Figure 10C:
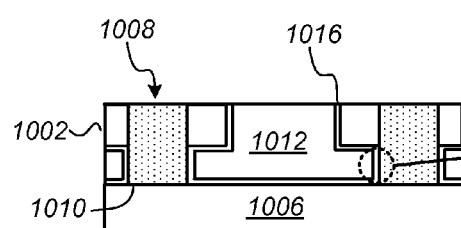
Figure 10D:
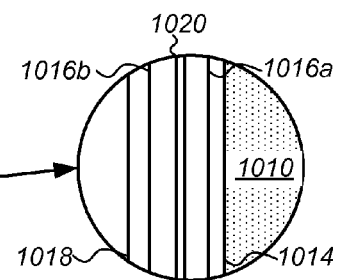

Referring to FIGS. 10C and 10D, a tunnel dielectric layer 1014, a multi-layer charge-trapping region 1016A-C, and a blocking dielectric layer 1018 are sequentially deposited in the opening, and the surface of the dielectric layer 1002 planarized to yield the intermediate structure shown in FIG. 10C. As in the embodiments described above, the multi-layer charge trapping layer 1016A-C is a split multi-layer charge trapping layer including at least an inner oxygen-rich first nitride layer 1016A closest to the tunnel dielectric layer 1014, and an outer, oxygen-lean second nitride layer 1016B. Optionally, the first and second charge trapping layers can be separated by an intermediate oxide or anti-tunneling layer 1016C.

Figure 10E:
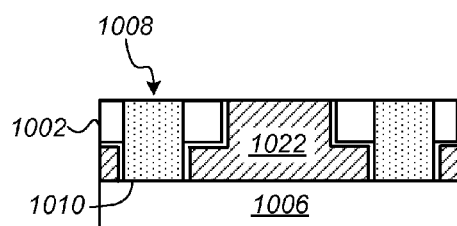
Figure 10F:
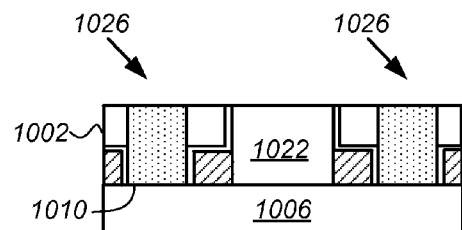

Next, a high work function gate electrode 1022 is deposited into the second opening 1012 and the surface of the upper dielectric layer 1002 planarized to yield the intermediate structure illustrated in FIG. 10E. As with the embodiments described above, the high work function gate electrode 1022 includes a doped polysilicon layer having a dopant concentration of from about 1e14 $cm^{-2}$ to about 1e16 $cm^{-2}$ so that the minimum energy needed to remove an electron from the gate electrode is from at least about 4.8 eV to about 5.3 eV. The polysilicon layer of the high work function gate electrode 1022 is grown directly as a doped polysilicon layer through the addition of gases such as phosphine, arsine, diborane or $BF_2$, to the CVD process.

Finally, an opening 1024 is etched through the gate layer 1022 to form control gates of separate memory devices 1026A and 1026B.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A memory device, comprising:
    a gate structure;
    a channel positioned between and electrically connecting a first diffusion region and a second diffusion region; and
    a tunnel dielectric layer, a multi-layer charge trapping layer, and a blocking dielectric layer disposed between the gate structure and the channel,
    wherein the multi-layer charge trapping layer comprises a first dielectric layer disposed abutting a second dielectric layer and an anti-tunneling layer disposed between the first and second dielectric layers, wherein the anti-tunneling layer includes an oxide layer, and wherein the first dielectric layer includes oxygen-rich nitride and the second dielectric layer includes oxygen-lean nitride.

2. The memory device of claim 1, wherein the channel, first and second diffusion regions are formed at least partially within a semiconductor material structure.

3. The memory device of claim 1, wherein the channel, first and second diffusion regions are disposed above a semiconductor material structure.

4. The memory device of claim 1, wherein the channel, first and second diffusion regions are suspended above a semiconductor material structure.

5. The memory device of claim 1, wherein the channel is vertical and oriented substantially perpendicular to a semiconductor material structure.

6. The memory device of claim 1, wherein the first dielectric layer is disposed abutting the tunnel dielectric layer and substantially trap free, and wherein the second dielectric layer is disposed abutting the blocking dielectric layer.

7. The memory device of claim 1, wherein the blocking dielectric layer comprises high K high temperature oxide (HTO).

8. The memory device of claim 1, wherein the channel includes a silicon nanowire channel.

9. The memory device of claim 1, wherein the gate structure includes a high work function gate electrode.

10. The memory device of claim 8, further comprising:
    a gate-all-around (GAA) structure wherein the silicon nanowire channel is enclosed on all four sides by the gate structure.

11. The memory device of claim 9, wherein the high work function gate electrode comprises a P+ doped polysilicon layer.

12. A semiconductor device, comprising:
a memory device including,
- a gate structure including a first high work function gate electrode,
- a channel positioned between and electrically connecting a first diffusion region and a second diffusion region, wherein the channel is vertical and oriented substantially perpendicular to a semiconductor material structure, and
- a tunnel dielectric layer, a multi-layer charge trapping layer, and a blocking dielectric layer disposed between the gate structure and the channel, wherein the multi-layer charge trapping layer comprises a first dielectric layer disposed abutting a second dielectric layer, wherein the first dielectric layer includes oxygen-rich nitride and the second dielectric layer includes oxygen-lean nitride; and
- a metal oxide semiconductor (MOS) logic device including a gate oxide layer and a second high work function gate electrode disposed thereon.

13. The semiconductor device of claim 12, wherein the first dielectric layer of the multi-layer charge trapping layer is disposed abutting the tunnel dielectric layer and substantially trap free, and wherein the second dielectric layer is disposed abutting the blocking dielectric layer.

14. The semiconductor device of claim 12, wherein the MOS logic device is formed at least partially within a semiconductor material structure.

15. The semiconductor device of claim 14, wherein the channel is vertical and oriented substantially orthogonal to the semiconductor material structure.

16. A semiconductor device, comprising:
a memory device including,
- a gate structure including a first high work function gate electrode,
- a blocking dielectric layer disposed abutting the gate structure,
- a multi-layer charge trapping layer disposed abutting the blocking dielectric layer, wherein the multi-layer charge trapping layer comprises a first dielectric layer disposed abutting a second dielectric layer, wherein the first dielectric layer includes oxygen-rich nitride and the second dielectric layer includes oxygen-lean nitride,
- a tunnel dielectric layer disposed abutting the multi-layer charge trapping layer, and
- a channel disposed abutting the tunnel dielectric layer, wherein the channel is positioned between and electrically connecting a first diffusion region and a second diffusion region, wherein the channel is vertical and oriented substantially perpendicular to a semiconductor material structure; and
a metal oxide semiconductor (MOS) logic device including a gate oxide layer and a second high work function gate electrode disposed thereon.

17. The semiconductor device of claim 16, wherein the MOS logic device is formed at least partially on the semiconductor material structure.

18. The semiconductor device of claim 16, wherein the multi-layer charge trapping layer further comprises an anti-tunneling layer disposed between the first and second dielectric layers, and wherein the anti-tunneling layer includes an oxide layer.

* * * * *